(12) United States Patent
Lanzillo et al.

(10) Patent No.: US 12,438,077 B2
(45) Date of Patent: Oct. 7, 2025

(54) DAMASCENE INTERCONNECT SPACER TO FACILITATE GAP FILL

(71) Applicant: International Business Machines Corporation, Armonk, NY (US)

(72) Inventors: Nicholas Anthony Lanzillo, Wynantskill, NY (US); Timothy Mathew Philip, Albany, NY (US); Kevin W. Brew, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 704 days.

(21) Appl. No.: 17/454,378

(22) Filed: Nov. 10, 2021

(65) Prior Publication Data

US 2023/0144842 A1    May 11, 2023

(51) Int. Cl.
*H01L 23/522*   (2006.01)
*H01L 21/768*   (2006.01)
*H01L 23/532*   (2006.01)

(52) U.S. Cl.
CPC .... *H01L 23/5226* (2013.01); *H01L 21/76829* (2013.01); *H01L 21/76843* (2013.01); *H01L 21/76871* (2013.01); *H01L 23/53238* (2013.01)

(58) Field of Classification Search
CPC .......... H01L 23/5226; H01L 21/76829; H01L 21/76843; H01L 21/76871; H01L 23/53238; H01L 21/76831; H01L 21/76865; H01L 21/76834; H01L 21/76883; H01L 21/76849
See application file for complete search history.

(56) References Cited

U.S. PATENT DOCUMENTS

| | | | |
|---|---|---|---|
| 6,756,313 B2 | 6/2004 | Choi et al. |
| 7,008,871 B2 | 3/2006 | Andricacos et al. |
| 7,422,984 B2 | 9/2008 | Okamoto |
| 7,772,702 B2 | 8/2010 | Bielefeld et al. |
| 8,178,437 B2 | 5/2012 | Chang et al. |
| 9,343,406 B2 | 5/2016 | Zhang et al. |
| 9,362,166 B2 | 6/2016 | Ishizaka et al. |
| 9,780,035 B1 | 10/2017 | Briggs et al. |
| 9,799,555 B1 | 10/2017 | Zhang et al. |

(Continued)

OTHER PUBLICATIONS

Russell, et al., "Precision integrated thickness control with gas cluster ion beam patch," TEL Epion Inc, TEL Technology Center America, https://www.spiedigitallibrary.org/conference-proceedings-of-spie, downloaded Aug. 24, 2021, 8 pgs.

(Continued)

*Primary Examiner* — Ermias T Woldegeorgis
(74) *Attorney, Agent, or Firm* — Kimberly Zillig

(57) ABSTRACT

A semiconductor component includes a dielectric layer including an opening. The semiconductor component further includes a liner arranged in the opening in direct contact with the dielectric layer. The semiconductor component further includes a wetting layer arranged in the opening in direct contact with the liner. The semiconductor component further includes an interconnect structure arranged in the opening in direct contact with the wetting layer. The semiconductor component further includes a cap arranged in the opening in direct contact with the interconnect structure and separated from the wetting layer by a spacer.

19 Claims, 19 Drawing Sheets

(56) References Cited

U.S. PATENT DOCUMENTS

| | | | |
|---|---|---|---|
| 10,418,326 B2* | 9/2019 | Jung | H01L 21/76873 |
| 2003/0207585 A1 | 11/2003 | Choi et al. | |
| 2005/0001325 A1 | 1/2005 | Andricacos et al. | |
| 2005/0042785 A1 | 2/2005 | Okamoto | |
| 2007/0202689 A1 | 8/2007 | Choi et al. | |
| 2008/0073748 A1 | 3/2008 | Bielefeld et al. | |
| 2008/0142971 A1* | 6/2008 | Dordi | H01L 21/28562 |
| | | | 257/E21.171 |
| 2008/0280432 A1 | 11/2008 | Chang et al. | |
| 2010/0200991 A1* | 8/2010 | Akolkar | C23C 16/45529 |
| | | | 257/E23.161 |
| 2015/0130063 A1 | 5/2015 | Zhang et al. | |
| 2015/0262872 A1 | 9/2015 | Ishizaka et al. | |
| 2018/0096888 A1 | 4/2018 | Naik | |
| 2018/0158781 A1* | 6/2018 | Jung | H01L 21/76879 |
| 2019/0304918 A1 | 10/2019 | Griggio et al. | |
| 2019/0393085 A1* | 12/2019 | Bhosale | H01L 21/76883 |

OTHER PUBLICATIONS

Anonymous, "Interconnect Structures and Process Flows for Improved Metal Cap Coverage," an IP.com Prior Art Database, IBM.com No. IPCOM000124950D, May 13, 2005, 5 pgs.

Huang et al., "Impact of Liner Metals on Copper Resistivity at Beyond 7nm Dimensions," 2018 IEEE International Interconnect Technology Conference (IITC), 2018, pp. 13-15, doi: 10.1109/IITC.2018.8430472.

* cited by examiner

DAMASCENE INTERCONNECT SPACER TO FACILITATE GAP FILL

BACKGROUND

The present disclosure relates to the electrical, electronic, and computer fields. In particular, the present disclosure relates to the interconnects of semiconductor devices and methods of making the interconnects of semiconductor devices.

In integrated circuits, interconnects are structures that connect two or more circuit elements together electrically. In addition to providing the electrical connection to the front end devices (such as transistors), interconnects also go all the way back to the power delivery networks. Thus, interconnects, and their surrounding support components, are considered back-end-of-line (BEOL) components. Lines provide electrical connection within a single layer, and vias provide electrical connection between layers in a physical electronic circuit.

SUMMARY

Embodiments of the present disclosure include a semiconductor component. The semiconductor component includes a dielectric layer including an opening. The semiconductor component further includes a liner arranged in the opening in direct contact with the dielectric layer. The semiconductor component further includes a wetting layer arranged in the opening in direct contact with the liner. The semiconductor component further includes an interconnect structure arranged in the opening in direct contact with the wetting layer. The semiconductor component further includes a cap arranged in the opening in direct contact with the interconnect structure and separated from the wetting layer by a spacer.

Additional embodiments of the present disclosure include a method of making a semiconductor component. The method includes forming a liner in an opening in a dielectric layer. The method further includes forming a wetting layer in the opening in direct contact with the liner. The method further includes forming an interconnect structure in the opening in direct contact with the wetting layer. The method further includes recessing the interconnect structure and the wetting layer relative to the dielectric layer. The method further includes forming a spacer on top of the wetting layer and in direct contact with the liner. The method further includes forming a cap on top of the interconnect structure and in direct contact with the spacer such that the cap is not in direct contact with the wetting layer.

Additional embodiments of the present disclosure include a method of making a semiconductor component. The method includes forming a liner in an opening in a dielectric layer. The method further includes forming a wetting layer in the opening in direct contact with the liner. The method further includes forming an interconnect structure in the opening in direct contact with the wetting layer. The method further includes recessing the interconnect structure relative to the dielectric layer. The method further includes forming a spacer on top of the interconnect structure and in direct contact with the wetting layer. The method further includes forming a cap on top of the interconnect structure and in direct contact with the spacer such that the cap is not in direct contact with the wetting layer.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1:
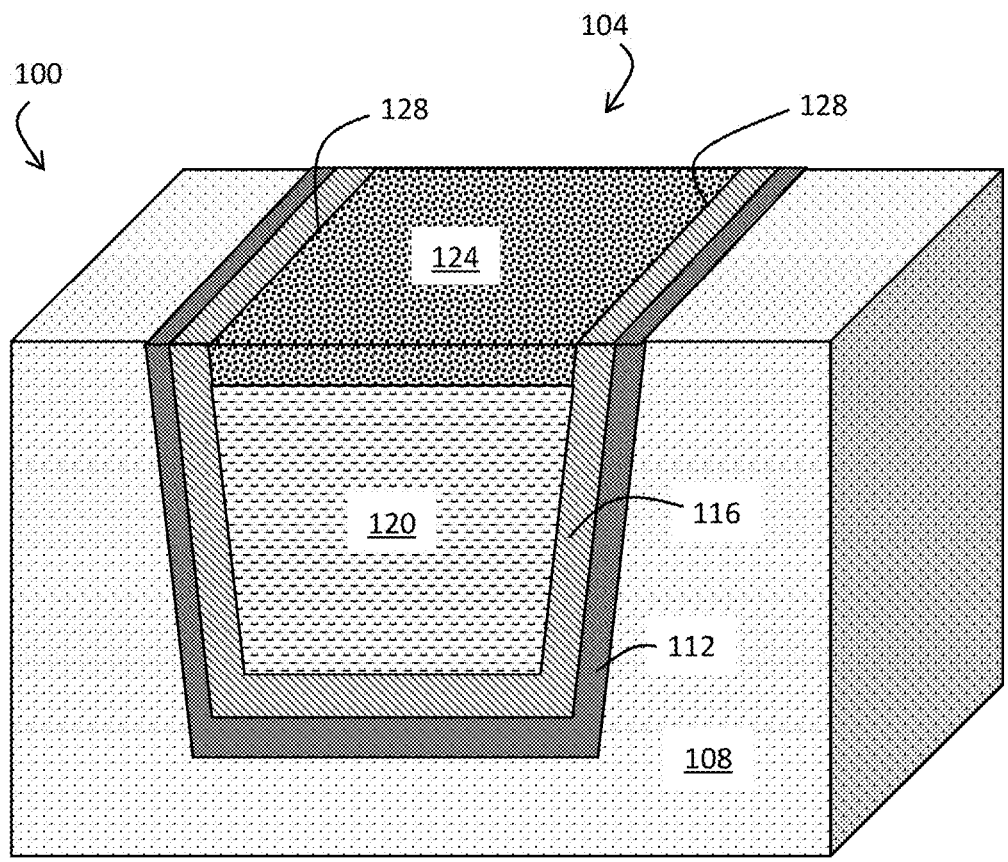
FIG. 1 is a schematic diagram illustrating an example semiconductor component including a lower level line, an upper level via, and an upper level line, in accordance with embodiments of the present disclosure.

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in integrated circuits, interconnects are structures that connect two or more circuit elements (such as transistors or power rails) together electrically. In addition to providing the electrical connection to the front end devices (such as transistors), interconnects also go all the way back to the power delivery networks. Thus, interconnects, and their surrounding support components, are considered back-end-of-line (BEOL) components. Lines provide electrical connection within a single layer, and vias provide electrical connection between layers in a physical electronic circuit.

In current interconnect technologies, interconnect structures are typically made of copper due to its low resistivity. However, as interconnect technology is scaled to smaller sizes, copper begins to suffer from problematic diffusion. Accordingly, liner materials, also referred to as diffusion barrier materials, are typically used to line a trench or cavity formed in the dielectric material that is filled subsequently with the interconnect material. Thus, a liner or diffusion barrier made of the liner material or diffusion barrier material is arranged between the copper interconnect and the surrounding dielectric material to prevent electromigration and diffusion of copper into the surrounding dielectric material. One example of a material that is commonly used for a liner or diffusion barrier is tantalum nitride.

However, copper does not adhere well to many of the materials that are commonly used to form such diffusion barriers between the interconnect structures and the surrounding dielectric material. Accordingly, a wetting layer is often used to coat the interior exposed surfaces of the liner before the trench is filled with interconnect material. The wetting layer is made of a wetting material which adheres readily to the material of the diffusion barrier and also is readily adhered to by copper. Accordingly, the wetting layer enhances the completeness to which the trench is filled with the interconnect material. The more completely the trench is filled, the lower the likelihood that voids, which enable undesirable electromigration, will form.

One example material that is commonly used for a wetting layer is cobalt. However, as interconnect technology is scaled to smaller sizes, the performance of cobalt as a wetting layer begins to deteriorate. In particular, once interconnect pitches are scaled below approximately 30 nanometers, voids begin to form in interconnects having cobalt wetting layers, which indicates that cobalt is no longer performing adequately as a wetting layer. To address this issue that is arising with cobalt wetting layers, ruthenium is increasingly being considered for use as a wetting layer instead. At tighter interconnect pitches, ruthenium outperforms cobalt as a wetting layer.

In addition to a diffusion barrier liner and a wetting layer, copper interconnects are typically covered with a cap. More specifically, the uppermost surface of a copper interconnect that has been filled into the lined trench is typically covered with a cap. Such a cap prevents electromigration of the copper into surrounding materials. In current interconnect technologies, cobalt is typically used to form these caps because cobalt is able to be selectively grown on the copper interconnect surface using known fabrication processes, such as, for example, conformal cap deposition.

Using ruthenium for a wetting layer due to its superior performance at tighter interconnect pitches and using cobalt for a cap due to its ability to be selectively grown on copper interconnect surfaces, however, introduces a new issue. In particular, ruthenium and cobalt are incompatible with one another in these circumstances due to their propensity for interdiffusion. In other words, ruthenium and cobalt are completely miscible. The interdiffusion of ruthenium and cobalt generates voids, which enable the electromigration that the two materials were intended to prevent. Therefore, interfaces where a ruthenium wetting layer and a cobalt cap are in direct contact with one another suffer from catastrophic interdiffusion, which ultimately leads to product failure.

As an illustrative example, FIG. 1 depicts a semiconductor component 100 including an interconnect structure 104. As shown in FIG. 1, an interconnect trench in the dielectric layer 108 is lined with a diffusion barrier 112 before being lined with a wetting layer 116 and is filled subsequently with an interconnect material 120. The interconnect material 120 is then covered with a cap 124. The resulting interfaces 128 of the wetting layer 116 and the cap 124 produce catastrophic interdiffusion when the wetting layer 116 is made of ruthenium and the cap 124 is made of cobalt.

Embodiments of the present disclosure may overcome these and other drawbacks of existing solutions by forming a spacer to separate the cap from the wetting layer. As discussed in further detail below, such embodiments include forming a spacer such that the cap and the wetting layer are entirely prevented from coming into direct contact with one another.

Figure 2A:
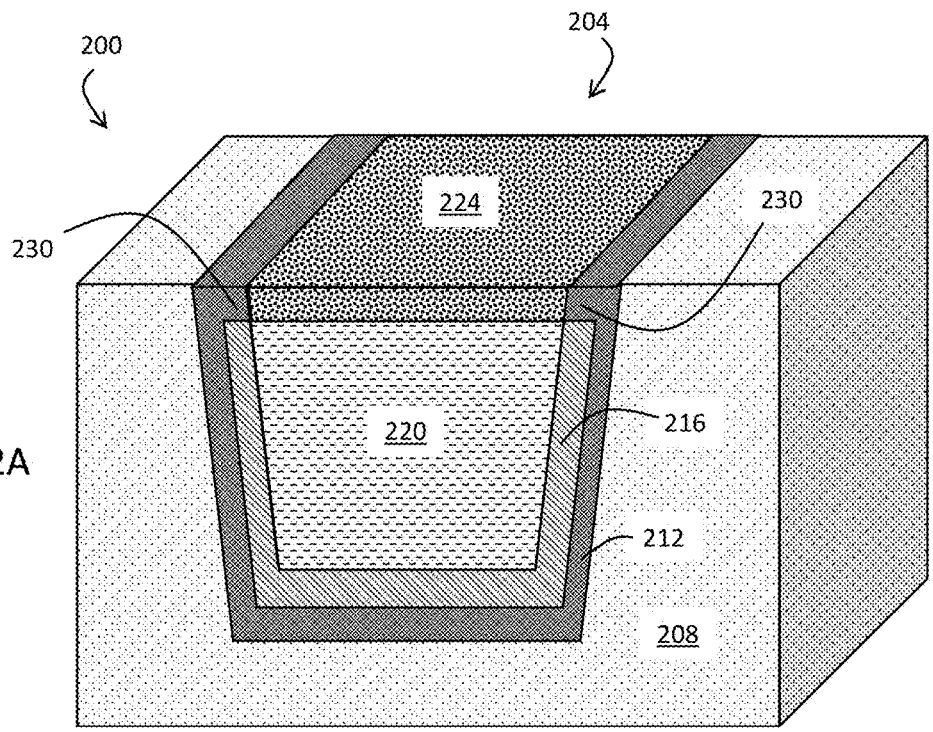
FIG. 2A is a schematic diagram illustrating an example semiconductor component following the performance of a portion of an example method, in accordance with embodiments of the present disclosure.

One example embodiment of the present disclosure is illustrated in FIG. 2A, wherein the semiconductor component 200 includes a spacer 230 that is formed by recessing the interconnect material 220, the wetting layer 216, and possibly the liner 212, prior to depositing a spacer material on top of the interconnect structure 204. In such embodiments, as set forth in further detail below, the spacer 230 is formed in direct contact with the liner 212 and the wetting layer 216 prior to the formation of the cap 224, which is formed in direct contact with the interconnect structure 220. Therefore, in such embodiments, the spacer 230 eliminates any interfaces of direct contact between the wetting layer 216 and the cap 224, thereby preventing catastrophic interdiffusion between the two.

Figure 2B:
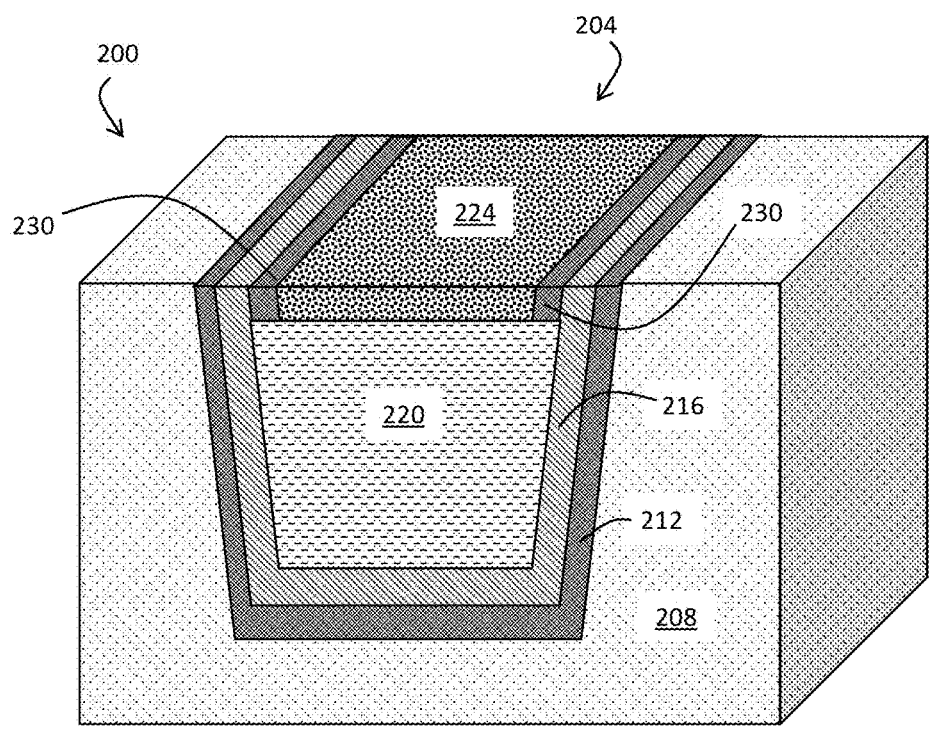
FIG. 2B is a schematic diagram illustrating the example semiconductor component of FIG. 2A following the performance of a further portion of the example method, in accordance with embodiments of the present disclosure.

Another example embodiment of the present disclosure is illustrated in FIG. 2B, wherein the semiconductor component 200 includes a spacer 230 that is formed by recessing the interconnect material 220 prior to depositing a spacer material on top of the interconnect structure 204. In such embodiments, as set forth in further detail below, the spacer 230 is formed in direct contact with the interconnect material 220 and the wetting layer 216 prior to the formation of the cap 224, which is formed in direct contact with the interconnect material 220. Therefore, in such embodiments, the spacer 230 eliminates any interfaces of direct contact between the wetting layer 216 and the cap 224, thereby preventing catastrophic interdiffusion between the two.

In general, the various processes used to form lines and vias for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a transistor and the many wires that connect the millions of transistors of a circuit, lithography and etch pattern transfer steps are repeated multiple times. Each pattern being printed on the substrate is aligned to previously formed patterns, and gradually the conductive and insulative regions are built up to form the final device.

These processes can be used in different combinations and orders within the context of two main integration schemes for forming lines and vias. A subtractive scheme refers to processes of forming line and via structures by depositing metal, and then etching the metal to form lines and vias. Alternatively, a damascene scheme refers to the processes of forming line and via structures by depositing an oxide layer, forming a trench into the oxide layer, and then depositing metal into the trench. In particular, in a typical dual damascene process (also referred to as a dual damascene flow), a structure undergoes a diffusion barrier etch step, then a via dielectric is deposited. A subsequent etch step then forms a gap in which metal is deposited to form the lines and vias simultaneously. Subtractive and damascene schemes can both be used in the formation of complex interconnect structures. Embodiments of the semiconductor component set forth in this disclosure are formed using damascene schemes.

Figure 3:
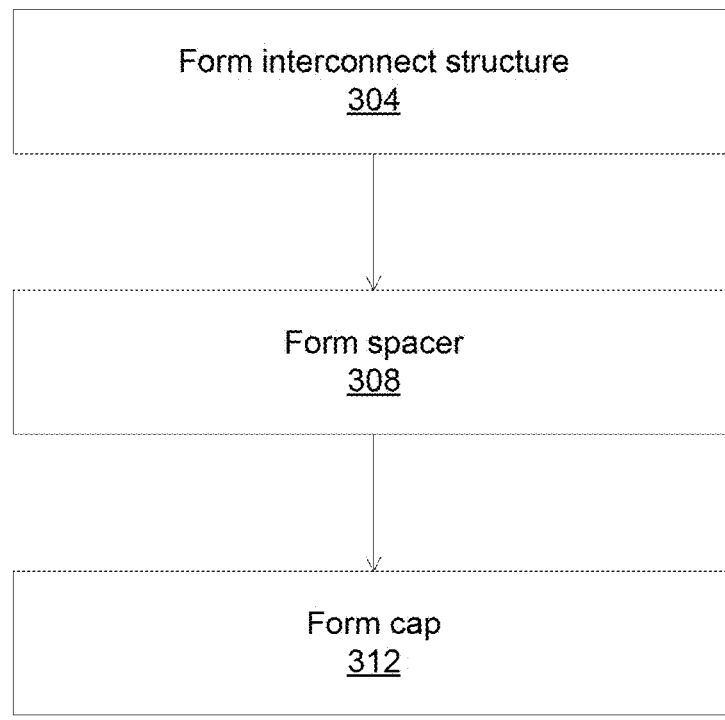
FIG. 3 illustrates a flowchart of an example method for forming a semiconductor component, in accordance with embodiments of the present disclosure.

FIG. 3 depicts a flowchart of an example method 300 for forming a semiconductor component, according to embodiments of the present disclosure. The method 300 begins with operation 304, wherein an interconnect structure is formed. In accordance with at least one embodiment of the present disclosure, the performance of operation 304 further includes the performance of a number of sub-operations.

More specifically, the performance of operation 304 includes forming a dielectric layer and forming an opening in the dielectric layer. In accordance with at least one embodiment of the present disclosure, the dielectric layer can be made of, for example, a low-k dielectric material. In accordance with embodiments of the present disclosure, the opening is a line trench. In accordance with at least one embodiment of the present disclosure, the line trench can be formed, for example, by selectively etching the dielectric material of the dielectric layer.

In accordance with at least one embodiment of the present disclosure, the line trench is one of many that is formed in the dielectric layer. The line trench disclosed herein is discussed in the context of line trenches that are being formed having interconnect pitches that are less than approximately 30 nanometers. Accordingly, while only one line trench is illustratively described, the description applies to line trenches and structures formed therein on the scale and in numbers that are typical of current semiconductor component fabrication.

Figure 4A:
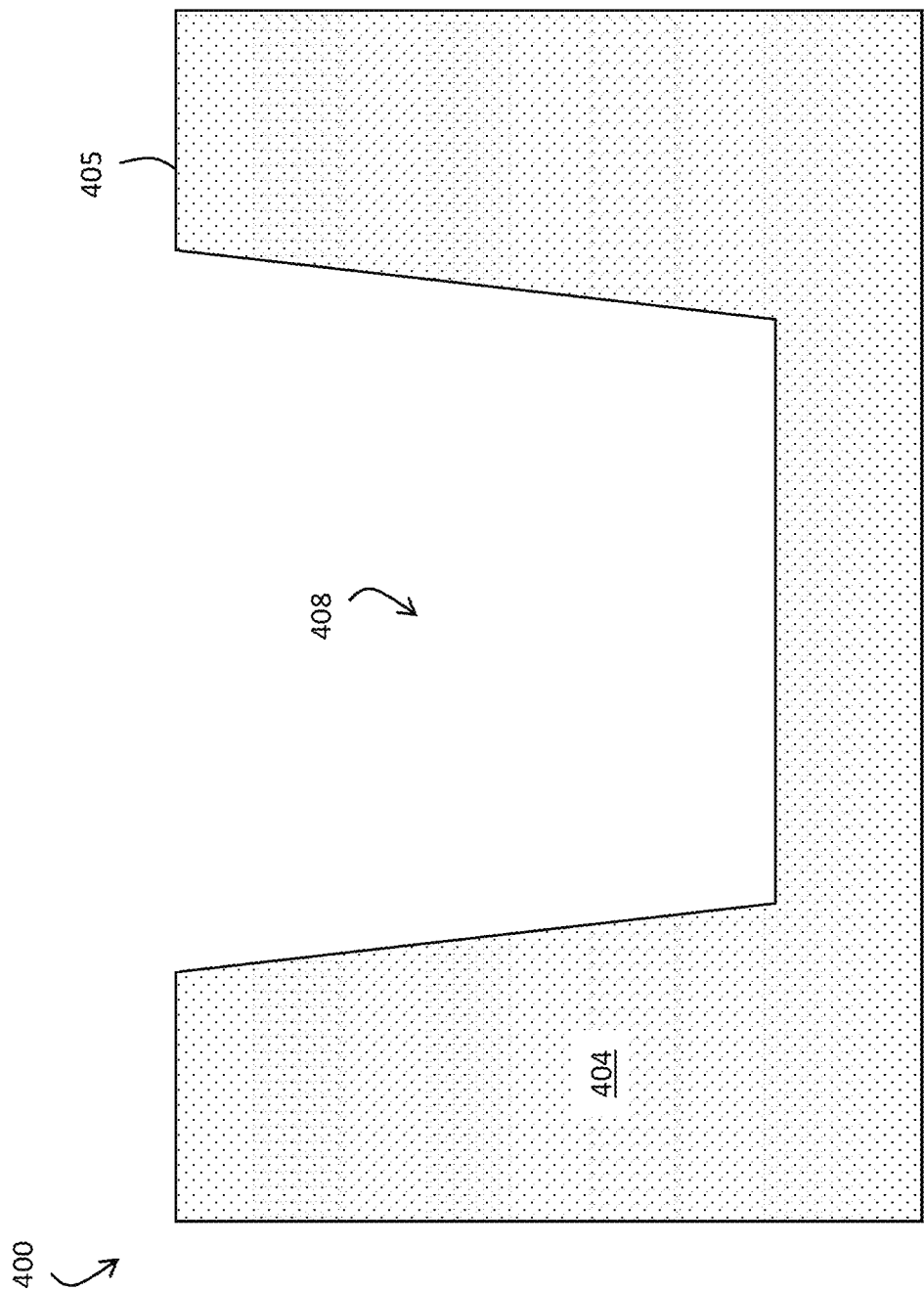
FIG. 4A illustrates an example of a component following the performance of a portion of the example method of FIG. 3, in accordance with embodiments of the present disclosure.

FIG. 4A depicts an example structure 400 following the performance of the above portions of operation 304. In particular, FIG. 4A depicts a dielectric layer 404 and a line trench 408 formed in the dielectric layer 404. The dielectric layer 404 has an uppermost surface 405, and the line trench 408 is formed as a recess relative to the uppermost surface 405.

In accordance with at least one embodiment of the present disclosure, the performance of operation 304 further includes forming a liner and a wetting layer in the line trench. In particular, the liner is made of a barrier material that coats the interior surfaces of the dielectric layer exposed by the formation of the line trench. In other words, the liner is arranged in the line trench in direct contact with the dielectric layer. The barrier material that forms the liner can be, for example, tantalum nitride.

The wetting layer is made of a wetting material that coats the interior surfaces of the liner. In other words, the wetting layer is arranged in the line trench in direct contact with the liner. Accordingly, the wetting layer is separated from the dielectric layer by the liner. Put another way, the liner is in direct contact with both the wetting layer and the dielectric layer and is interposed between the wetting layer and the dielectric layer such that the wetting layer and the dielectric layer are not in direct contact with one another. In accordance with embodiments of the present disclosure, the wetting layer can be, for example, ruthenium.

Figure 4B:
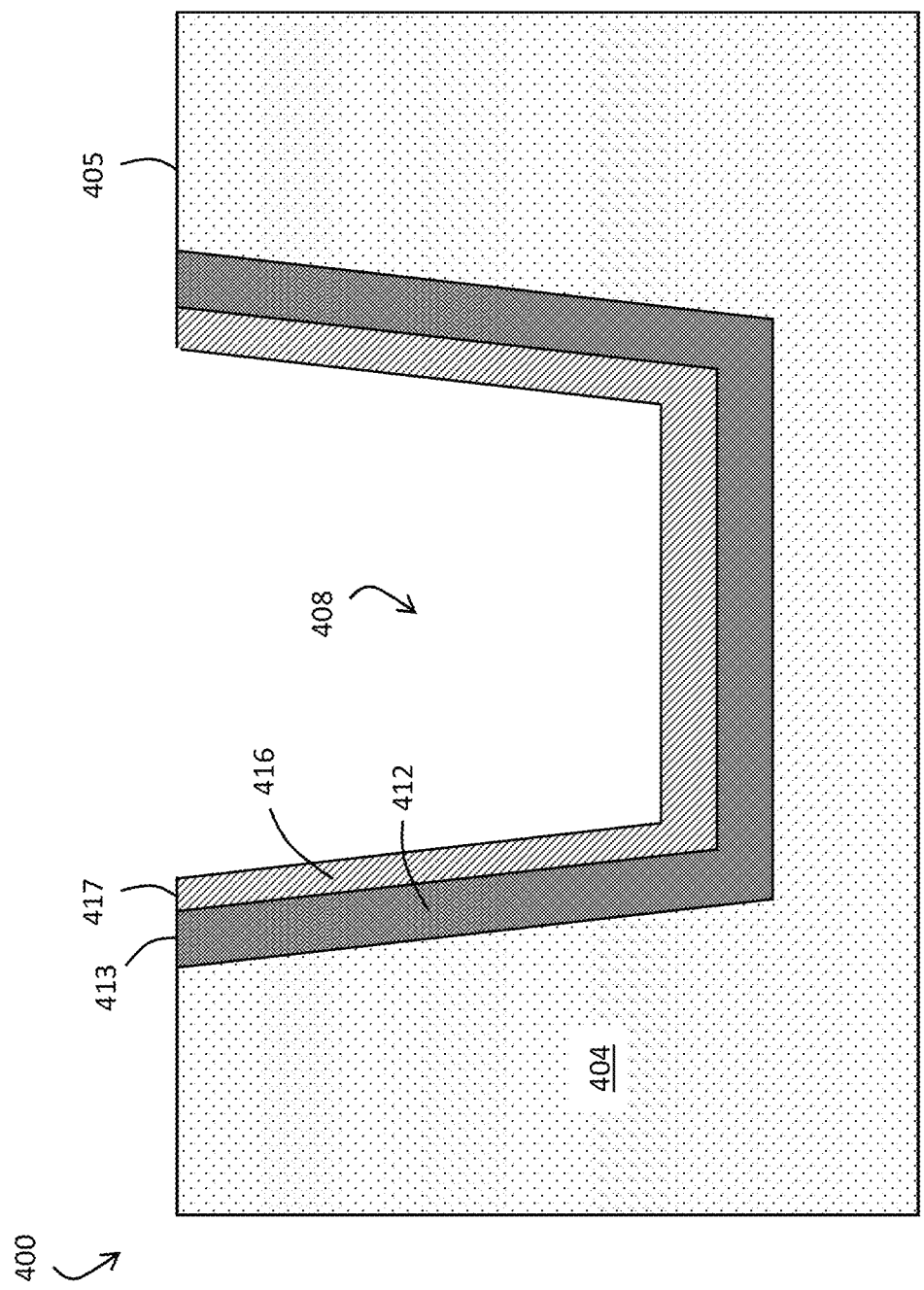
FIG. 4B illustrates an example of a component following the performance of a portion of the example method of FIG. 3, in accordance with embodiments of the present disclosure.

FIG. 4B depicts the example structure 400 following the performance of this portion of operation 304. In particular, in FIG. 4B, the line trench 408 has been lined with a liner 412 and, subsequently, with a wetting layer 416. The liner 412 and the wetting layer 416 have been formed such that their uppermost surfaces 413, 417 are substantially coplanar with the uppermost surface 405 of the dielectric layer 404. This can be accomplished by, for example, performing a CMP process.

In accordance with at least one embodiment of the present disclosure, the performance of operation 304 further includes filling the lined line trench with interconnect material. In accordance with at least one embodiment of the present disclosure, the interconnect material is copper. Further discussion may refer to the interconnect material as copper, but other suitable interconnect materials may be used instead of copper. The copper of the resulting line is in direct contact with the wetting layer. In accordance with at least one embodiment of the present disclosure, the performance of operation 304 further includes planarizing the structure to remove excess interconnect material, barrier material, and wetting material that are outside of the line trench as well as to ensure that the uppermost surfaces of the interconnect material, the wetting layer, and the liner are substantially coplanar with the uppermost surface of the dielectric layer. In accordance with at least one embodiment of the present disclosure, planarizing the structure can include performing CMP on the structure.

Figure 4C:
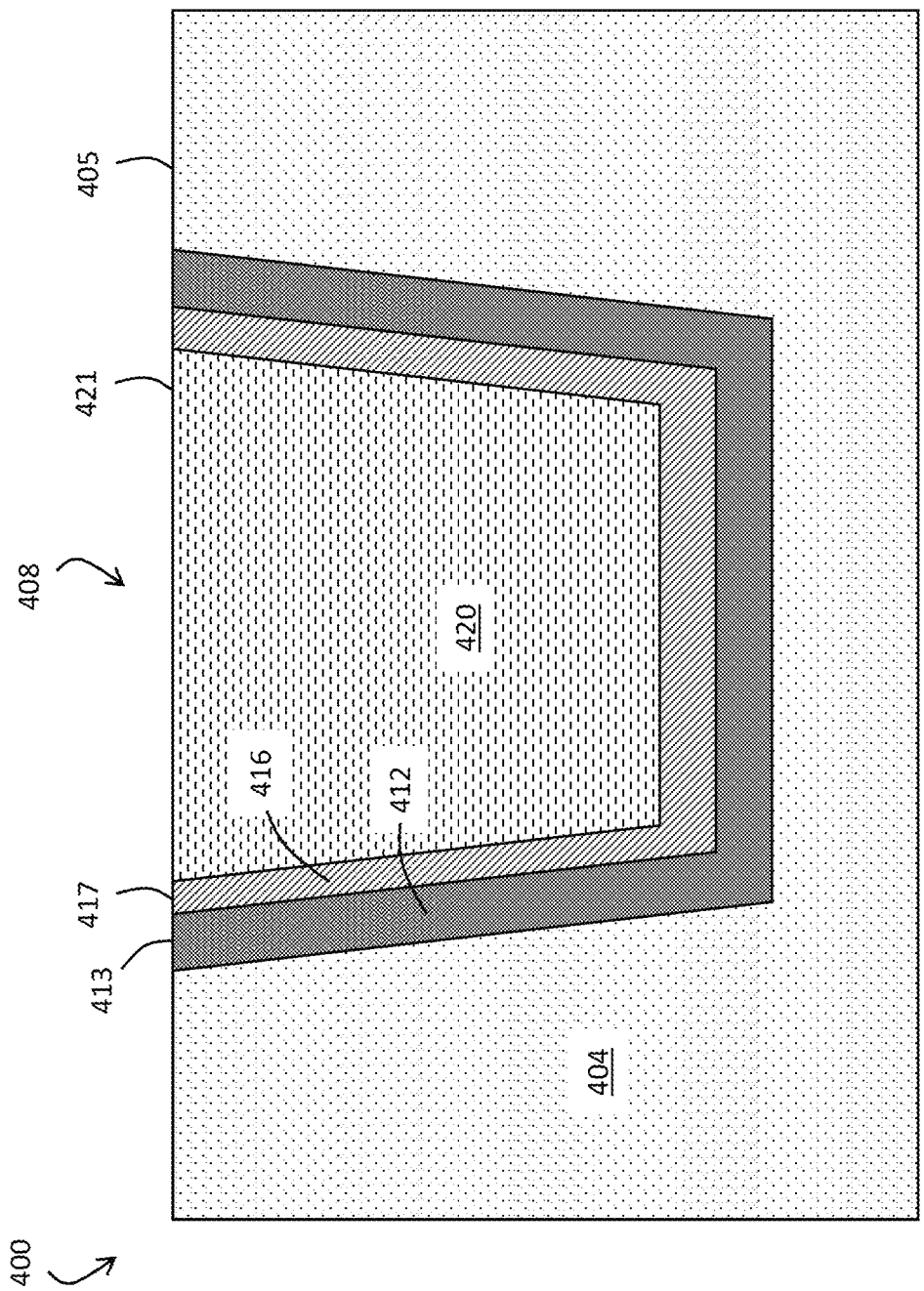
FIG. 4C illustrates an example of a component following the performance of a portion of the example method of FIG. 3, in accordance with embodiments of the present disclosure.

FIG. 4C depicts the example structure 400 following the performance of operation 304. In particular, in FIG. 4C, the line trench 408 has been filled with copper 420 to form a line of the interconnect structure. Therefore, the copper 420 is arranged in the line trench 408 in direct contact with the wetting layer 416. Accordingly, the copper 420 is separated from the surrounding dielectric material of the dielectric layer 404 by the liner 412 and by the wetting layer 416. The uppermost surface 421 of the copper 420 is substantially coplanar with the uppermost surface 417 of the wetting layer 416, with the uppermost surface 413 of the liner 412, and with the uppermost surface 405 of the dielectric layer 404.

Returning to FIG. 3, the method 300 proceeds from operation 304 to operation 308, wherein a spacer is formed. In accordance with at least one embodiment of the present disclosure, the performance of operation 308 further includes the performance of a number of sub-operations. Additionally, the performance of operation 308 can be achieved by performing more than one distinct group of sub-operations, two of which are discussed in further detail herein. In particular, a first illustrative embodiment of the present disclosure includes performing a first group of sub-operations to form the spacer, and a second illustrative embodiment of the present disclosure includes performing a second group of sub-operations to form the spacer. The first embodiment is discussed below with reference to FIGS. 5A-5D, and the second embodiment is discussed below with reference to FIGS. 6A-6D.

In accordance with the first embodiment of the present disclosure, the performance of operation 308 further includes recessing the wetting layer and the interconnect material of the line relative to the uppermost surfaces of the liner and the dielectric layer. In some embodiments, at least a portion of the liner is also recessed when the wetting layer and the interconnect material are recessed. This may happen incidentally as a result of the fabrication processes used to recess the wetting layer and the interconnect material. In some embodiments, the liner is recessed to the same extent as the wetting layer and the interconnect material.

Figure 5A:
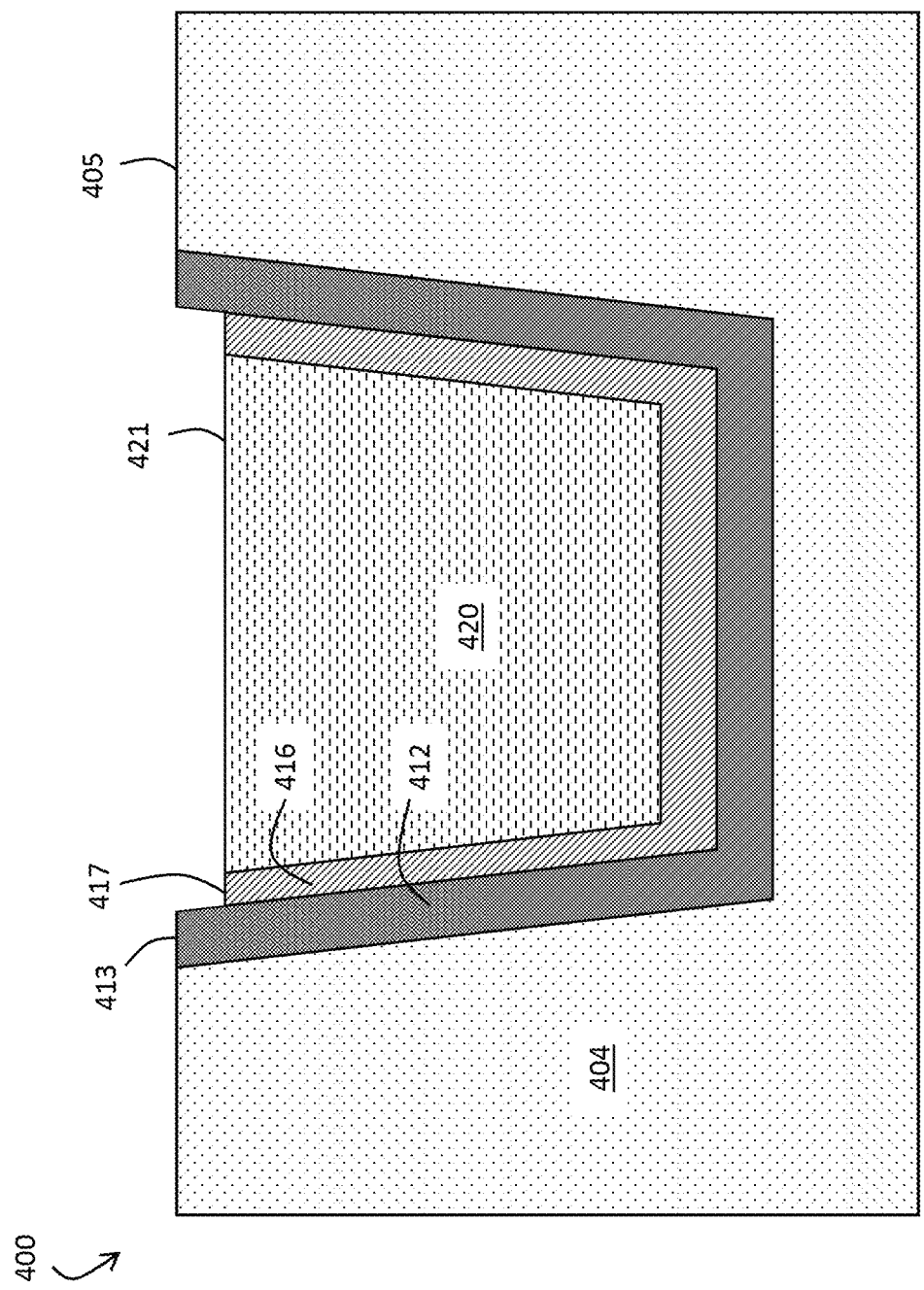
FIG. 5A illustrates an example of a component following the performance of a portion of the example method of FIG. 3, in accordance with embodiments of the present disclosure.

FIG. 5A depicts the example structure 400 following the performance of this portion of operation 308. As shown, the copper 420 and the wetting layer 416 have been recessed such that the uppermost surface 421 of the copper 420 and the uppermost surface 417 of the wetting layer 416 are lower than the uppermost surface 405 of the dielectric layer 404. Therefore, the uppermost surface 405 of the dielectric layer 404 is arranged higher than the uppermost surface 421 of the recessed copper 420 and the uppermost surface 417 of the recessed wetting layer 416.

As used herein, the phrase "lower than [a particular surface]" means extending to a lesser height than [the particular surface] relative to a lowermost surface of the dielectric layer in a direction that is substantially perpendicular to the lowermost surface of the dielectric layer. Conversely, as used herein, the phrase "higher than [a particular surface]" means extending to a greater height than [the particular surface] relative to the lowermost surface of the dielectric layer in a direction that is substantially perpendicular to the lowermost surface of the dielectric layer.

As noted above, the liner 412 may be intentionally or incidentally recessed when the copper 420 and the wetting layer 416 are recessed. (This is not depicted in FIG. 5A.) Accordingly, in such instances, the uppermost surface 413 of the recessed liner 412 is also arranged lower than the uppermost surface 405 of the dielectric layer 404. In some instances, less than all of the thickness of the liner 412 (extending from the wetting layer 416 to the dielectric layer 404) may be recessed. Alternatively, in some instances, all of the thickness of the liner 412 (extending from the wetting layer 416 to the dielectric layer 404) may be recessed. Whether any of the liner 412 is recessed and how much of the thickness of the liner 412 is recessed does not affect the functionality of the resulting component. As described in further detail below, the relevant fact is that the copper 420 and the wetting layer 416 are recessed.

In accordance with the first embodiment, the performance of operation 308 further includes depositing a spacer material over the structure. In accordance with at least one embodiment, the spacer material is an isotropic barrier metal. In accordance with at least one embodiment, the spacer material is a dielectric material such as, for example, a metal nitride. In accordance with at least one embodiment, the spacer material is silicon nitride.

Notably, the spacer material can be the same material as that of the liner. Accordingly, in such embodiments, depositing the spacer material results in the deposited spacer material becoming integrally formed with the existing liner material such that the spacer material and the liner material form one continuous body of homogenous material.

The spacer material is deposited such that it covers the uppermost surfaces of the dielectric layer, the liner, the wetting layer, and the interconnect material as well as the surfaces of the liner that were exposed by the recessing of the wetting layer. For embodiments wherein the entire thickness of the liner was also recessed, the spacer material covers the surfaces of the dielectric layer that were exposed by the recessing of the liner.

Figure 5B:
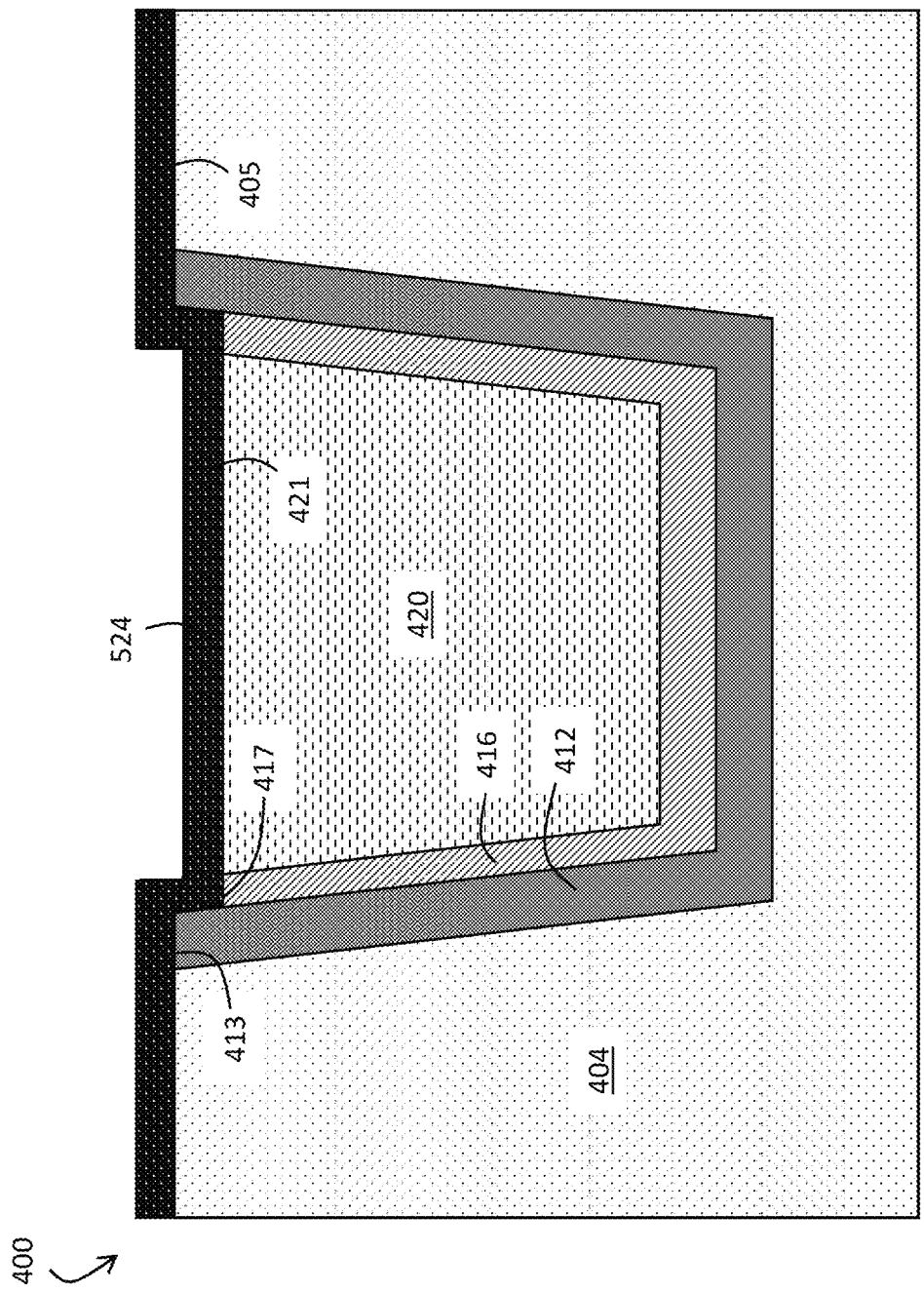
FIG. 5B illustrates an example of a component following the performance of a portion of the example method of FIG. 3, in accordance with embodiments of the present disclosure.

FIG. 5B depicts the example structure 400 following the performance of this portion of operation 308. As shown, a spacer material 524 has been deposited over the structure 400 such that the spacer material 524 is in direct contact with the dielectric layer 404, the liner 412, the wetting layer 416, and the copper 420. More specifically, the spacer material 524 is in direct contact with the uppermost surface 405 of the dielectric layer 404, the uppermost surface 421 of the recessed copper 420, and the uppermost surface 417 of the recessed wetting layer 416. In the embodiment shown in FIG. 5B, the liner 412 was not recessed when the copper 420 and the wetting layer 416 were recessed. Accordingly, the spacer material 524 is also in direct contact with the uppermost surface 413 of the un-recessed liner 412 and with portions of the side surfaces of the un-recessed liner 412 that were exposed by the recessing of the wetting layer 416. This will also be the case for embodiments (not shown) in which some amount greater than zero but less than the entire thickness of the liner 412 is recessed.

Alternatively, for embodiments (not shown) in which the entire thickness of the liner 412 is recessed with the wetting layer 416, the spacer material 524 will be in direct contact with the uppermost surface 405 of the dielectric layer 404, the uppermost surface 421 of the recessed copper 420, the uppermost surface 417 of the recessed wetting layer 416, the uppermost surface 413 of the recessed liner 412, and with portions of the side surfaces of the trench 408 (shown in FIG. 4A) in the dielectric layer 404 that were exposed by the recessing of the liner 412.

In accordance with the first embodiment, the performance of operation 308 further includes selectively etching the spacer material to form a spacer. More specifically, an etch back procedure can be performed to selectively remove the spacer material from all substantially horizontal surfaces of the structure, including the uppermost surface of the copper interconnect structure. Therefore, the spacer material only remains where it is in direct contact with the substantially non-horizontal side surfaces of the liner (or, for embodiments in which the entire thickness of the liner has been recessed, side surfaces of the dielectric layer in the trench). Due to the formation of the liner so as to coat the inside of the trench, the liner forms two substantially non-horizontal side surfaces. Accordingly, two spacers are formed by the performance of these operations. Any illustrative description herein of one spacer applies equally to both spacers.

Each spacer formed by the etch back procedure has an uppermost surface that is substantially coplanar with the uppermost surface of the dielectric layer and the uppermost surface of the liner. Accordingly, the uppermost surface of each spacer is higher than the uppermost surface of the wetting layer and the uppermost surface of the copper interconnect structure. For embodiments in which the liner was recessed, the uppermost surface of the spacer is substantially coplanar with the uppermost surface of the dielectric layer and is higher than the uppermost surfaces of the liner, the wetting layer, and the copper interconnect structure.

Importantly, regardless of whether the liner was recessed, the spacer covers the uppermost surface of the wetting layer. Accordingly, for embodiments wherein the liner was recessed, a thicker layer of the spacer material may need to be deposited on the structure such that the spacers extend far enough from the substantially non-horizontal surfaces of the dielectric layer that they still cover the uppermost surface of the wetting layer after the etch back procedure.

Following the formation of the spacers by the performance of operation 308, every surface of the wetting layer is covered. In particular, the outwardly facing side surfaces and the outwardly facing bottom surface of the wetting layer are in direct contact with the liner. The inwardly facing side surfaces and the inwardly facing bottom surface of the wetting layer are in direct contact with the copper interconnect structure. The exposed upwardly facing surfaces (extending from the inwardly facing to the outwardly facing sides surfaces) are in direct contact with the spacers. Accordingly, as set forth below, the wetting layer is completely prevented from coming into direct contact with the subsequently formed cap.

Figure 5C:
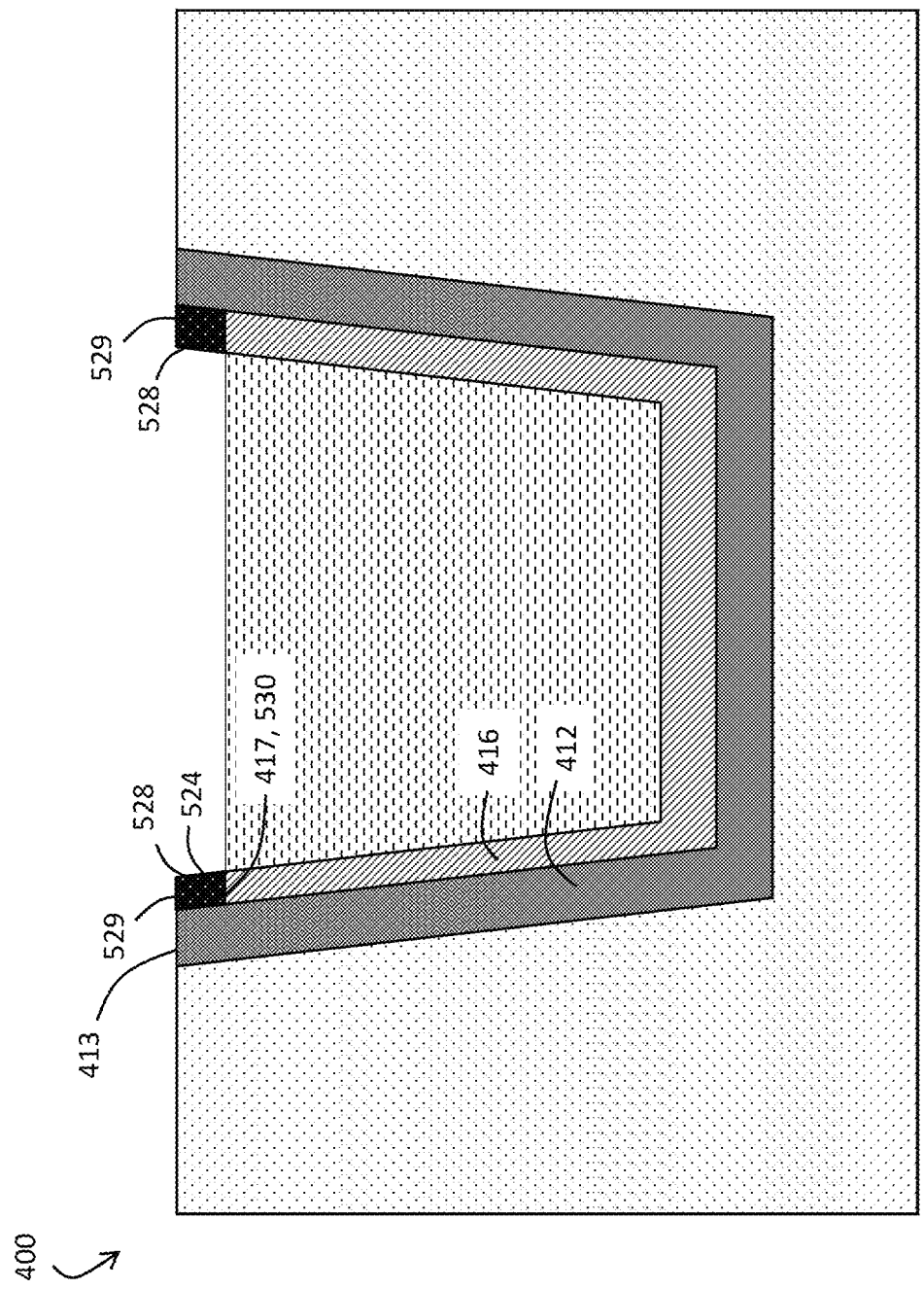
FIG. 5C illustrates an example of a component following the performance of a portion of the example method of FIG. 3, in accordance with embodiments of the present disclosure.

FIG. 5C depicts the structure 400 following the performance of operation 308. As shown, the spacer material 524 has been selectively etched to form the spacers 528. Each spacer 528 includes a lowermost surface 530 that is arranged in direct contact with the uppermost surface 417 of the recessed wetting layer 416. An uppermost surface 529 of each spacer 528, which is arranged opposite the lowermost surface 530, is substantially coplanar with the uppermost surface 413 of the liner 412. Thus, the uppermost surface 529 of each spacer 528 and the uppermost surface 413 of the liner 412 are arranged higher than the uppermost surface 417 of the wetting layer 416.

Returning to FIG. 3, the method 300 proceeds from operation 308 to operation 312, wherein a cap is formed. In accordance with at least one embodiment of the present disclosure, the performance of operation 312 further includes the performance of a number of sub-operations.

In accordance with at least one embodiment, the performance of operation 312 includes forming a cap in direct contact with the uppermost surface of the interconnect structure and such that an uppermost surface of the cap is substantially coplanar with the uppermost surface of the dielectric layer. In accordance with at least one embodiment, the cap can be formed by selectively growing the cap material on the uppermost surface of the interconnect structure, such as, for example, by conformal cap deposition. In accordance with at least one embodiment, the cap can be made of, for example, cobalt.

Figure 5D:
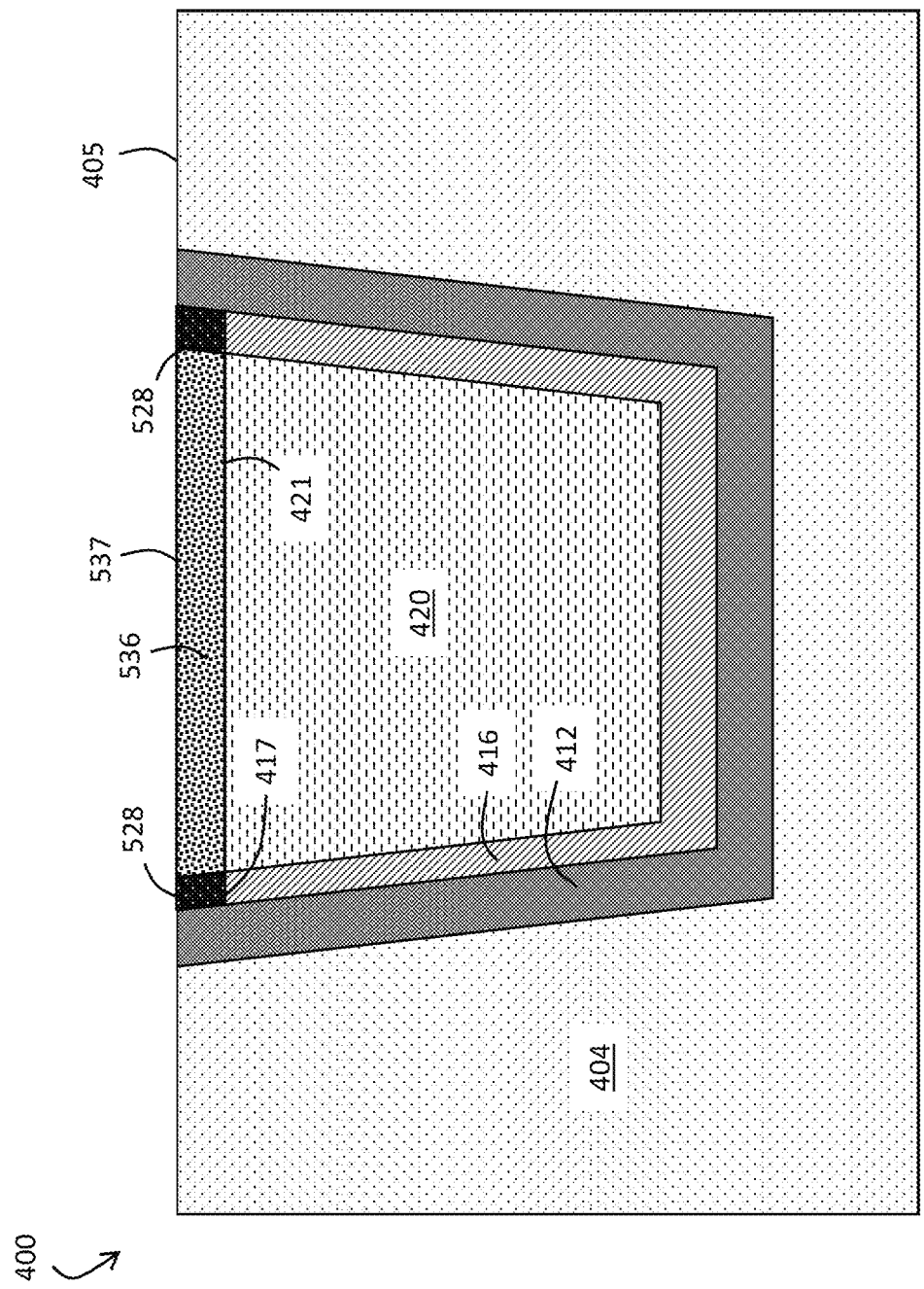
FIG. 5D illustrates an example of a component following the performance of a portion of the example method of FIG. 3, in accordance with embodiments of the present disclosure.

FIG. 5D depicts the example structure 400 following the performance of operation 312 in the context of the structure formed by the performance of the first embodiment of operation 308, discussed above with respect to FIGS. 5A-5C. Accordingly, as shown, the example structure 400 includes a cap 536 formed in direct contact with the uppermost surface 421 of the copper 420 and formed such that an uppermost surface 537 of the cap 536 is substantially coplanar with the uppermost surface 405 of the dielectric layer 404.

More specifically, because each spacer 528 is formed in direct contact with an inwardly facing side surface of the liner 412 and with the uppermost surface 417 of the wetting layer 416, each spacer 528 is interposed between the cap 536 and the liner 412. In other words, the spacer 528, together with the copper 420, separates the cap 536 from the wetting layer 416. Therefore, the cap 536 is prevented from coming into direct contact with an inwardly facing side surface of the wetting layer 416 by the copper 420 and from coming into direct contact with the uppermost surface 417 of the wetting layer 416 by the spacer 528.

Returning to FIG. 3, as noted above, the performance of operation 308 can be achieved, alternatively, by performing a second group of sub-operations to form the spacer. This second group, which makes up a second embodiment of operation 308, is discussed below with reference to FIGS. 6A-6D. Many of the resulting structures and functions of each embodiment are substantially similar. Therefore, similar structures are indicated with similar reference numerals (e.g., 624 is substantially similar to 524).

In accordance with the second embodiment of the present disclosure, the performance of operation 308 further includes recessing only the interconnect material of the line relative to the uppermost surfaces of the wetting layer, the liner, and the dielectric layer.

Figure 6A:
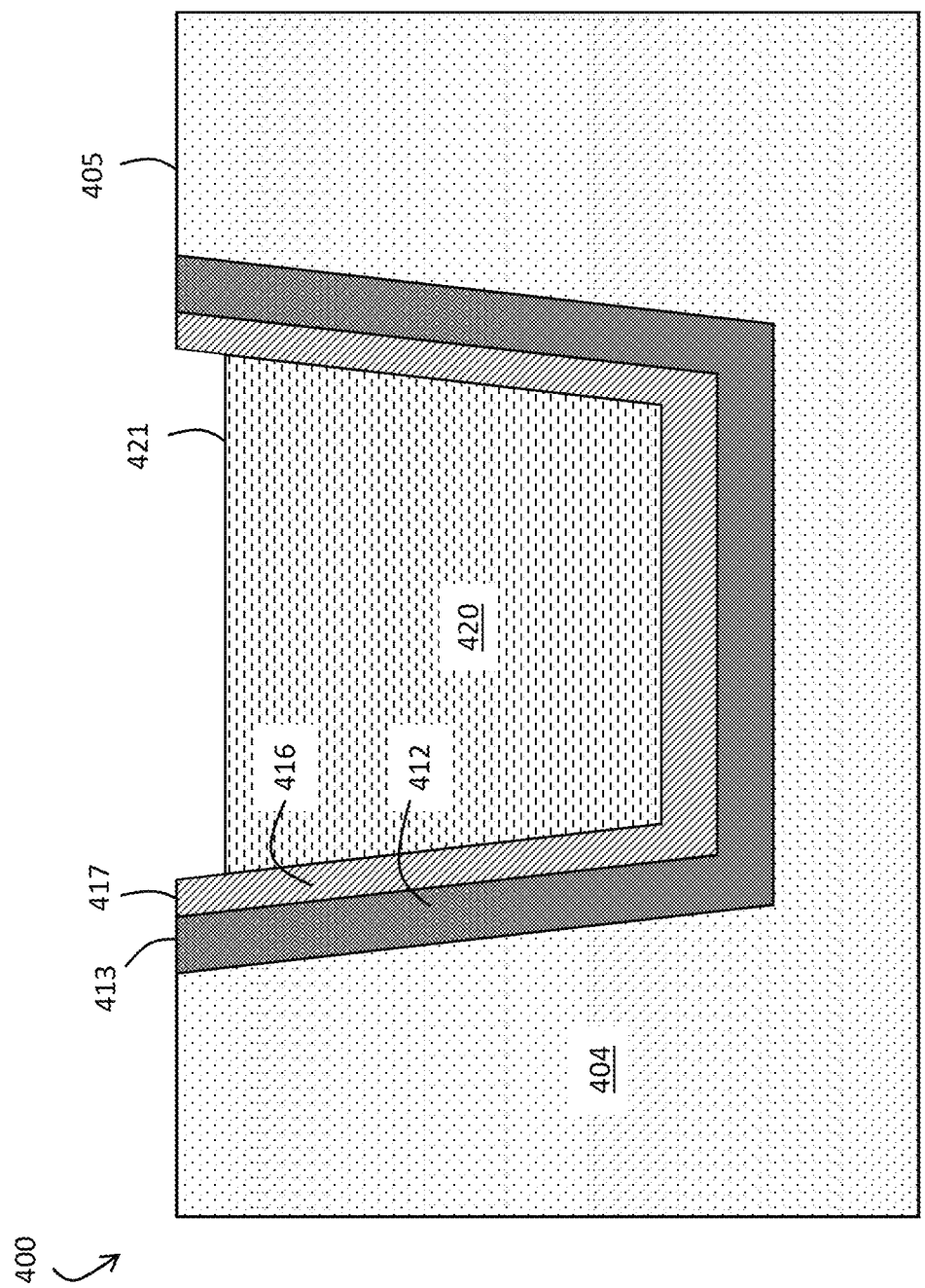
FIG. 6A illustrates an example of a component following the performance of a portion of the example method of FIG. 3, in accordance with embodiments of the present disclosure.

FIG. 6A depicts the example structure 400 following the performance of this portion of the second embodiment of operation 308. As shown, the copper 420 has been recessed such that the uppermost surface 421 of the copper 420 is lower than the uppermost surface 417 of the wetting layer, the uppermost surface 413 of the liner 412, and the uppermost surface 405 of the dielectric layer 404. Therefore, the uppermost surfaces 405, 413, and 417 are arranged higher than the uppermost surface 421 of the recessed copper 420.

In accordance with the second embodiment, the performance of operation 308 further includes depositing a spacer material over the structure. In accordance with at least one embodiment, the spacer material is an isotropic barrier metal. In accordance with at least one embodiment, the spacer material is a dielectric material such as, for example, a metal nitride. In accordance with at least one embodiment, the spacer material is silicon nitride. The spacer material can be the same material as that of the liner.

The spacer material is deposited such that it covers the uppermost surfaces of the dielectric layer, the liner, the wetting layer, and the interconnect material as well as the surfaces of the wetting layer that were exposed by the recessing of the interconnect material.

Figure 6B:
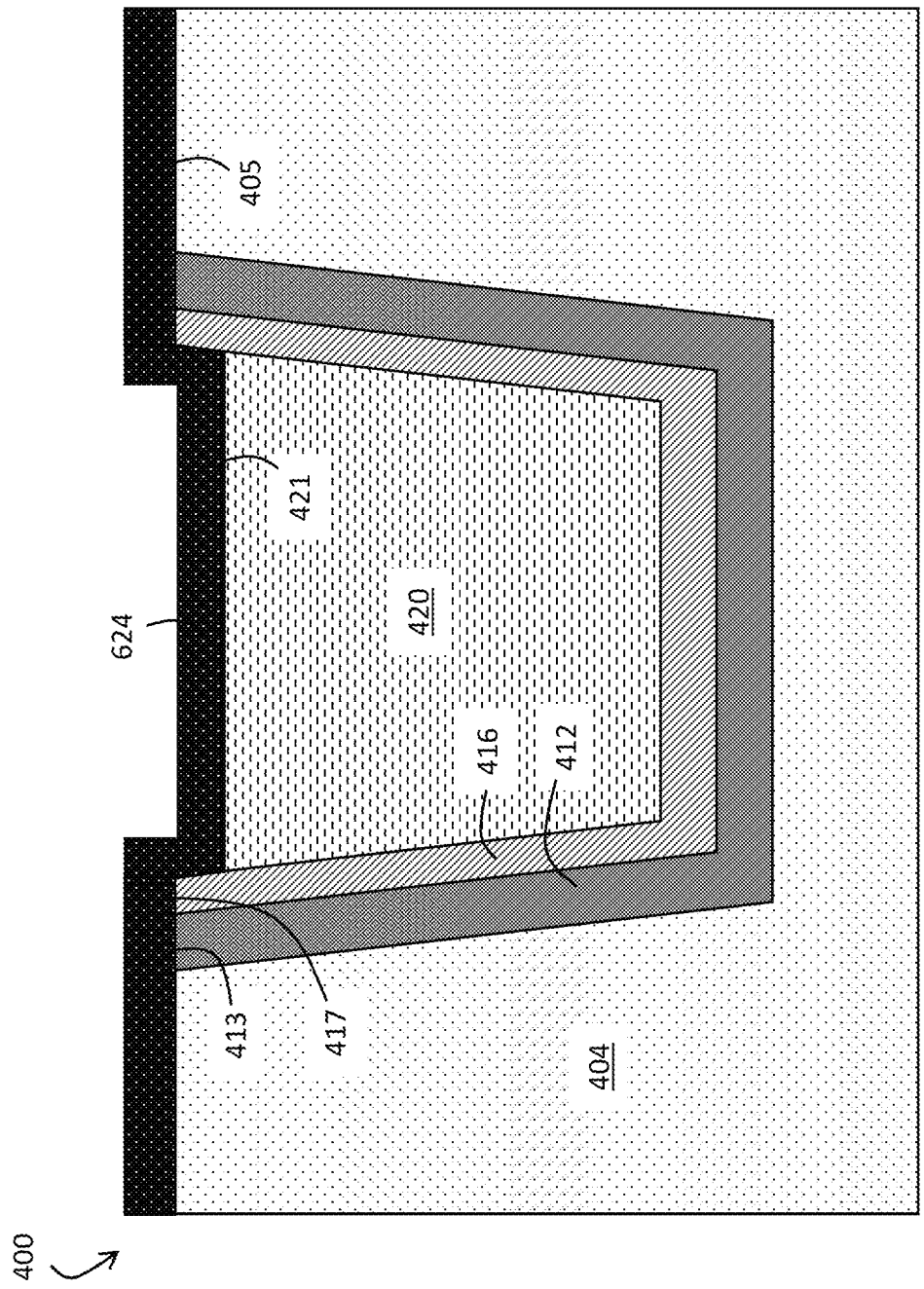
FIG. 6B illustrates an example of a component following the performance of a portion of the example method of FIG. 3, in accordance with embodiments of the present disclosure.

FIG. 6B depicts the example structure 400 following the performance of the second embodiment of this portion of operation 308. As shown, a spacer material 624 has been deposited over the structure 400 such that the spacer material 624 is in direct contact with the dielectric layer 404, the liner 412, the wetting layer 416, and the copper 420. More specifically, the spacer material 624 is in direct contact with the uppermost surface 405 of the dielectric layer 404, the uppermost surface 413 of the liner 412, the uppermost surface 417 of the wetting layer 416, and the uppermost surface 421 of the recessed copper 420. The spacer material 624 is also in direct contact with portions of the side surfaces of the un-recessed wetting layer 416 that were exposed by the recessing of the copper 420.

In accordance with the second embodiment, the performance of operation 308 further includes selectively etching the spacer material to form a spacer. More specifically, an etch back procedure can be performed to selectively remove the spacer material from all substantially horizontal surfaces of the structure, including the uppermost surface of the copper interconnect structure. Therefore, the spacer material only remains where it is in direct contact with the substantially non-horizontal side surfaces of the wetting layer. Due to the formation of the wetting layer as a coating inside the trench, the wetting layer forms two substantially non-horizontal side surfaces. Accordingly, two spacers are formed by the performance of these operations. Any illustrative description herein of one spacer applies equally to both spacers.

Each spacer formed by the etch back procedure has an uppermost surface that is substantially coplanar with the uppermost surfaces of the dielectric layer, the liner, and the wetting layer. Accordingly, the uppermost surface of each spacer is higher than the uppermost surface of the copper interconnect structure. Importantly, the spacers cover the entirety of the portions of the side surfaces of the wetting layer that were exposed by the etching of the interconnect structure.

Following the formation of the spacers by the performance of operation 308, the uppermost surface of the wetting layer remains exposed, but every other surface of the wetting layer is covered. The outwardly facing side surfaces and the outwardly facing bottom surface of the wetting layer are in direct contact with and are completely covered by the liner. The inwardly facing bottom surface of the wetting layer is in direct contact with and is completely covered by the copper interconnect structure. The inwardly facing side surfaces of the wetting layer are in direct contact with and are completely covered by the copper interconnect structure and the spacers. Accordingly, as set forth below, the wetting layer is completely prevented from coming into direct contact with the subsequently formed cap.

Figure 6C:
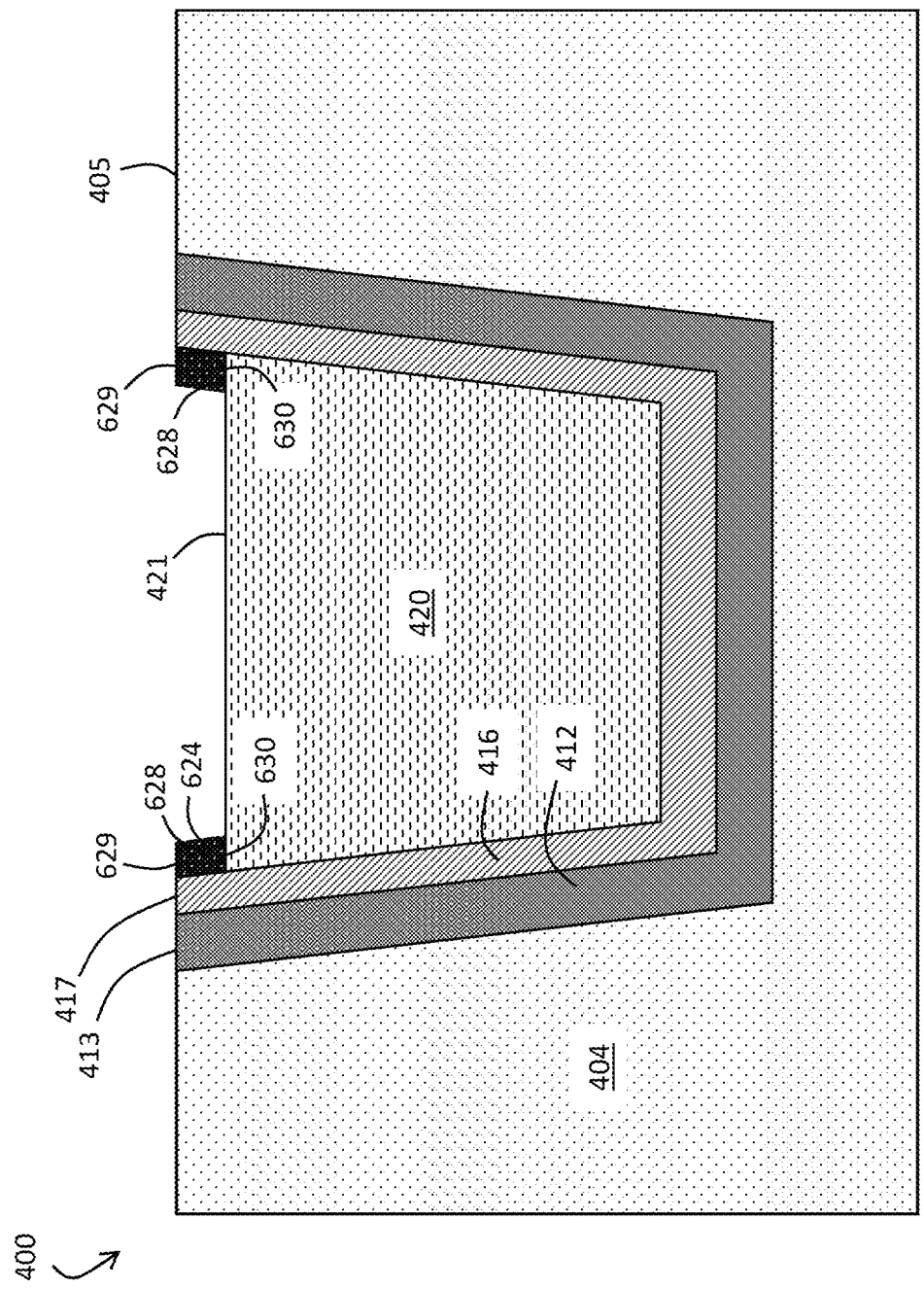
FIG. 6C illustrates an example of a component following the performance of a portion of the example method of FIG. 3, in accordance with embodiments of the present disclosure.

FIG. 6C depicts the structure 400 following the performance of the second embodiment of operation 308. As shown, the spacer material 624 has been selectively etched to form spacers 628. Each spacer 628 includes an uppermost surface 629 and a lowermost surface 630 arranged opposite the uppermost surface 629. Each lowermost surface 630 is arranged in direct contact with the uppermost surface 421 of the copper 420. Each uppermost surface 629 is substantially coplanar with the uppermost surfaces 405, 413, and 417 of the dielectric layer 404, the liner 412, and the wetting layer 416, respectively. Thus, the uppermost surface 629 of each spacer 628 is arranged higher than the uppermost surface 421 of the copper 420.

Additionally, upon the formation of the spacers 628, a first side surface of the wetting layer 416 is in direct contact with the liner 412 and a second side surface of the wetting layer 416, which is opposite the first side, is in direct contact with the spacer 628. More specifically, an outwardly facing surface of the wetting layer 416 is in direct contact with the liner 412, and an inwardly facing surface of the wetting layer 416 is in direct contact with the spacers 628.

Returning to FIG. 3, as noted above, the method 300 proceeds from operation 308 to operation 312, wherein a cap is formed. The performance of operation 312 is the same as that discussed above regardless of whether the first embodiment or the second embodiment of operation 308 was performed. Accordingly, the performance of operation 312 includes forming a cap in direct contact with the uppermost surface of the interconnect structure and such that an uppermost surface of the cap is substantially coplanar with the uppermost surface of the dielectric layer, in the manner discussed above.

Figure 6D:
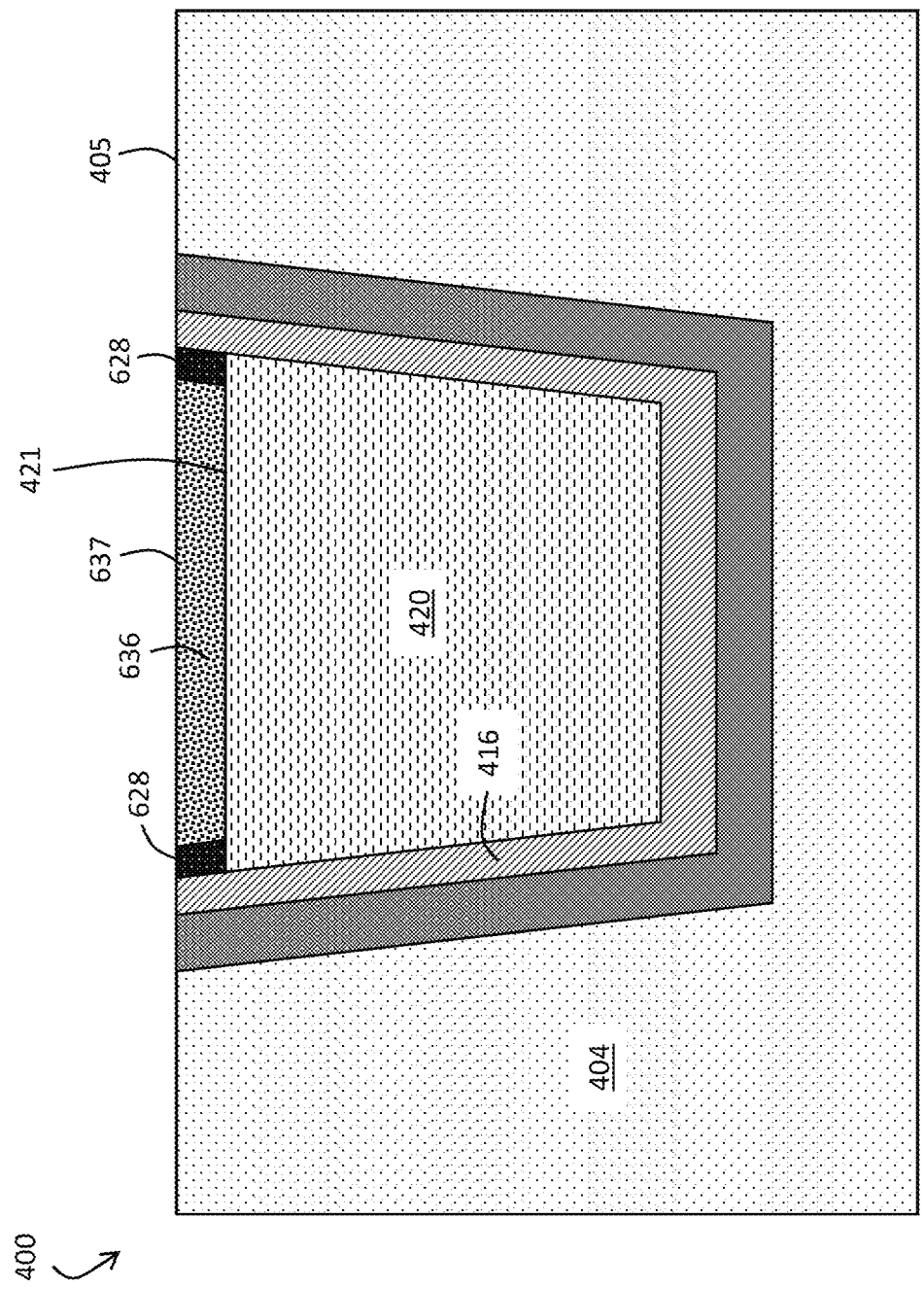
FIG. 6D illustrates an example of a component following the performance of a portion of the example method of FIG. 3, in accordance with embodiments of the present disclosure.

FIG. 6D depicts the example structure 400 following the performance of operation 312 in the context of the structure formed by the performance of the second embodiment of operation 308, discussed above with respect to FIGS. 6A-6C. Accordingly, as shown, the example structure 400 includes a cap 636 formed in direct contact with the uppermost surface 421 of the copper 420 and formed such that an uppermost surface 637 of the cap 636 is substantially coplanar with the uppermost surface 405 of the dielectric layer 404.

More specifically, because each spacer 628 is formed in direct contact with an inwardly facing side surface of the wetting layer 416 and the uppermost surface 421 of the copper 420, each spacer 628 is interposed between the cap 636 and the wetting layer 416. In other words, the spacer 628, together with the copper 420, separates the cap 636 from the wetting layer 416. Therefore, the cap 636 is prevented from coming into direct contact with an inwardly facing surface of the wetting layer 416.

The method 300 shown in FIG. 3 can also be performed in accordance with a third embodiment, as illustrated by FIGS. 7A-7D. The performance of the third embodiment of the method 300 is substantially similar to the performance of the method 300 including the performance of the first embodiment of operation 308 shown in FIGS. 4A-4C together with FIGS. 5A-5D. However, as discussed in further detail below, the performance of the third embodiment differs in its inclusion of the formation of a sacrificial hard mask during the formation of the interconnect structure at operation 304 and the formation of a sacrificial cap during the formation of the cap at operation 312.

In particular, in accordance with the third embodiment, the performance of operation 304 is substantially similar to that described above, except that it further includes forming a sacrificial hard mask in direct contact with the uppermost surface of the dielectric layer. The subsequent formation of the line trench therefore includes forming the line trench in the sacrificial hard mask as well as in the dielectric layer. Therefore, the liner formed in the trench is formed in direct contact with the dielectric layer as well as with the sacrificial hard mask.

Figure 7A:
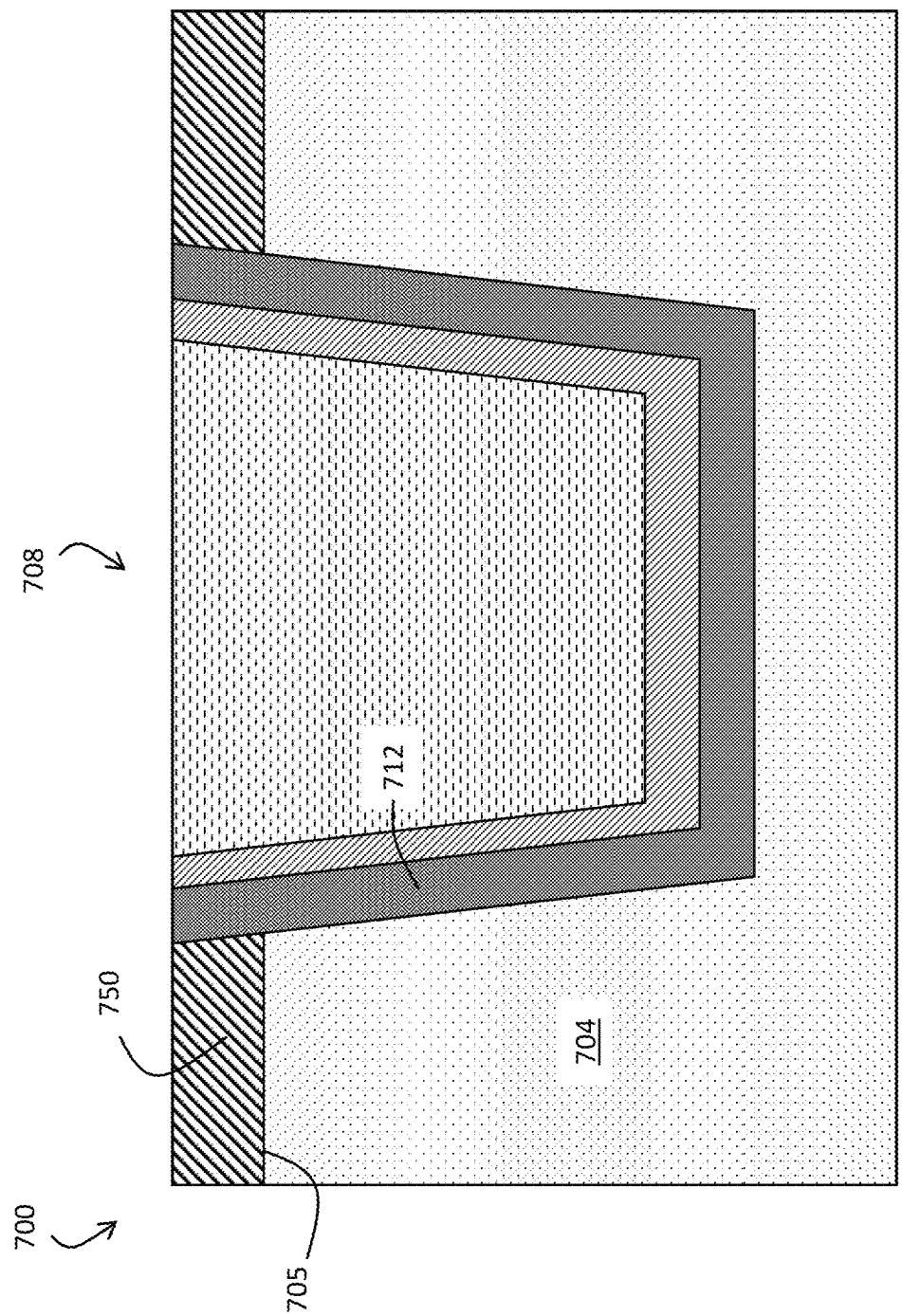
FIG. 7A illustrates an example of a component following the performance of a portion of the example method of FIG. 3, in accordance with embodiments of the present disclosure.

FIG. 7A depicts an example structure 700 following the performance of operation 304, wherein the interconnect structure is formed. The structure 700 is substantially similar to the structure 400 shown in FIG. 4C (following the performance of operation 304) except for the inclusion of the sacrificial hard mask 750 formed in direct contact with the uppermost surface 705 of the dielectric layer 704. The line trench 708 is formed in the sacrificial hard mask 750 and in the dielectric layer 704. Therefore, the liner 712 is formed in direct contact with both the dielectric layer 704 and the sacrificial hard mask 750.

In accordance with the third embodiment, the performance of operation 308, following the performance of operation 304, is substantially similar to that described above, except that the uppermost surface of the spacer is substantially coplanar with the uppermost surface of the sacrificial hard mask rather than with the uppermost surface of the dielectric layer.

Figure 7B:
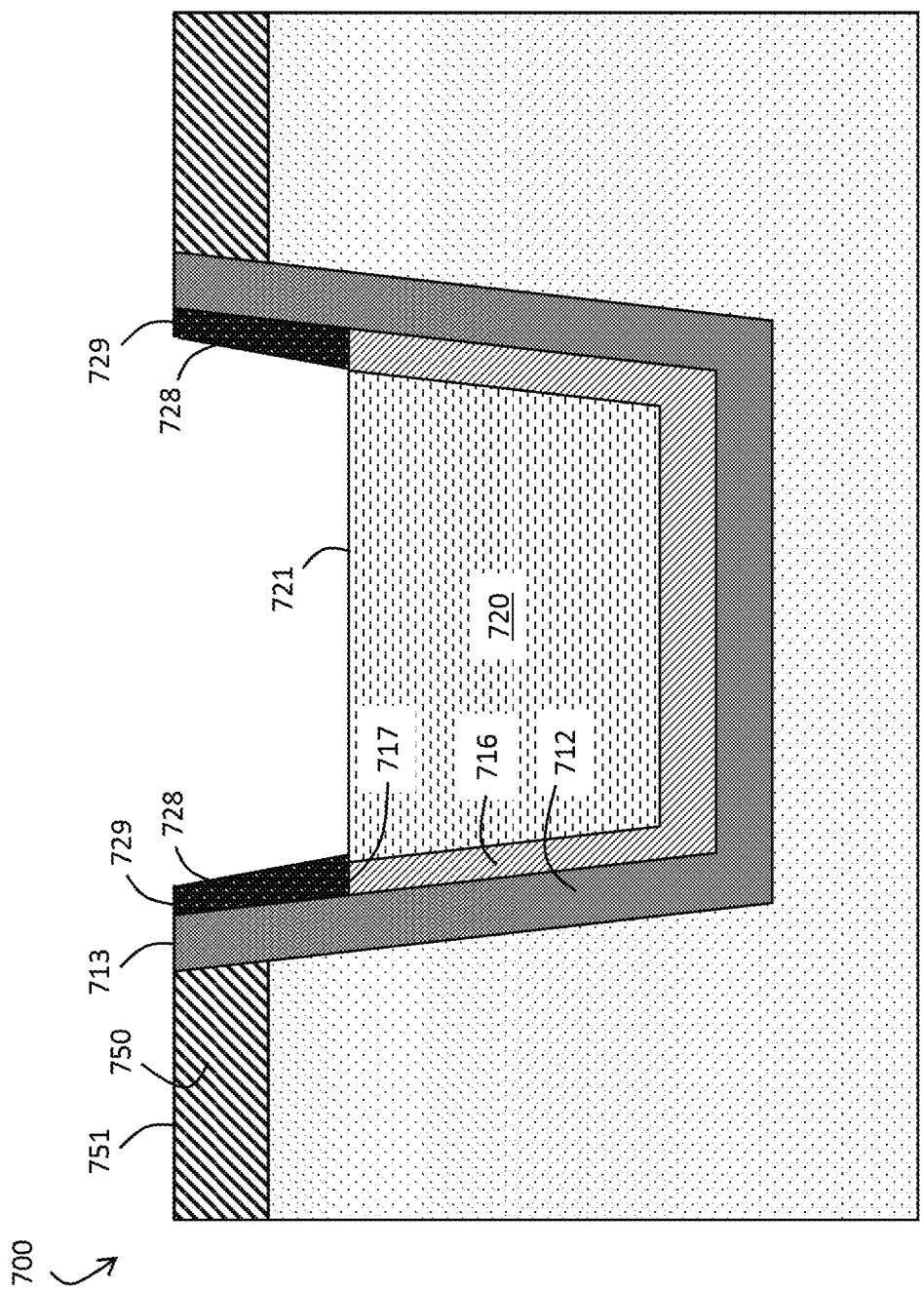
FIG. 7B illustrates an example of a component following the performance of a portion of the example method of FIG. 3, in accordance with embodiments of the present disclosure.

FIG. 7B depicts the example structure 700 following the performance of operation 308, wherein the spacer is formed. The structure 700 is substantially similar to the structure 400 shown in FIG. 5C (following the performance of the first embodiment of operation 308) except that the uppermost surface 729 of each spacer 728 is substantially coplanar with an uppermost surface 751 of the sacrificial hard mask 750 and an uppermost surface 713 of the liner 712 and is arranged above uppermost surfaces 721 and 717 of the copper 720 and the wetting layer 716, respectively.

In accordance with the third embodiment, the performance of operation 312, following the performance of operation 308, is substantially similar to that described above, except that a sacrificial cap is formed, and removed, prior to the formation of the cap.

Figure 7C:
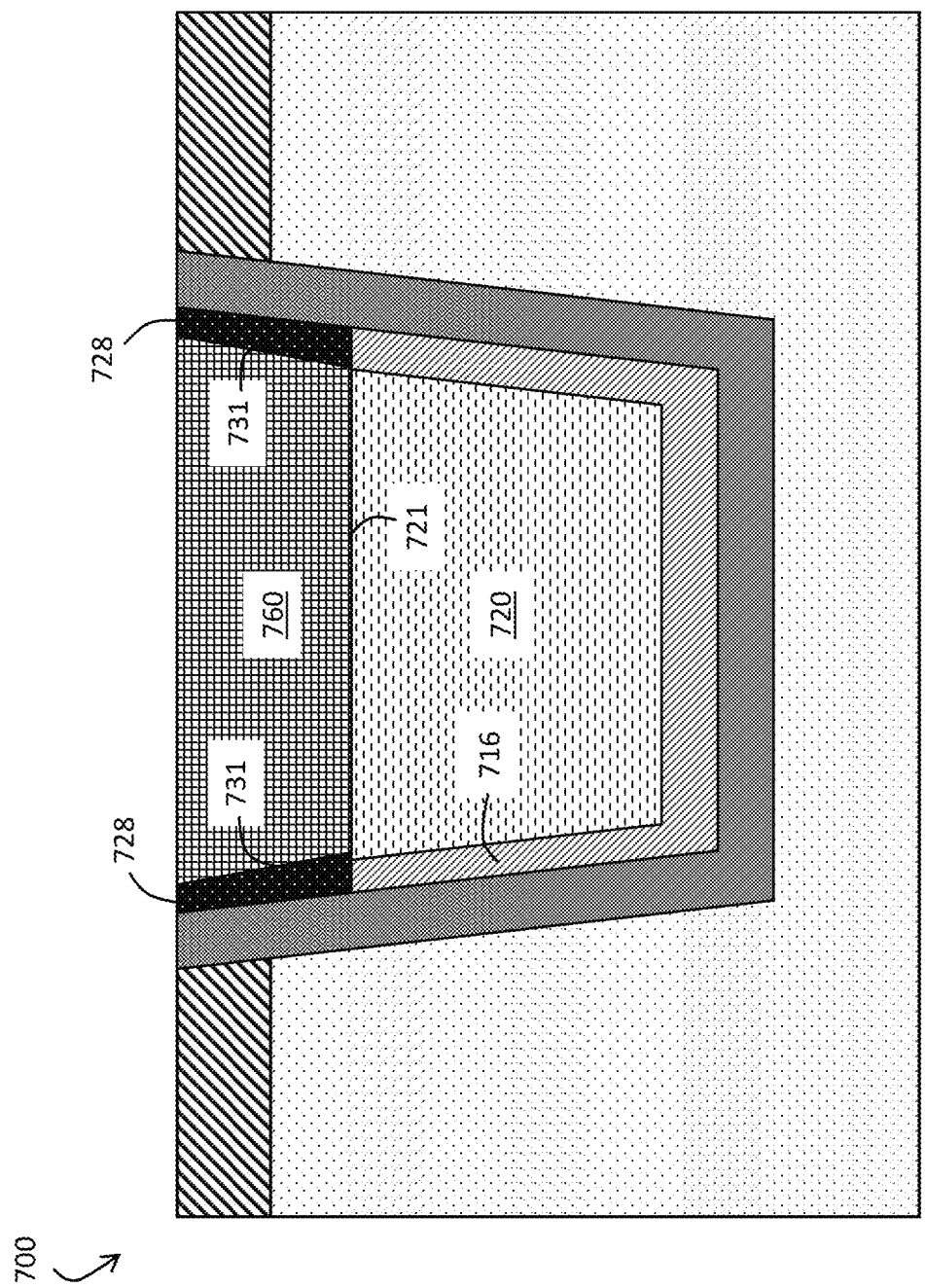
FIG. 7C illustrates an example of a component following the performance of a portion of the example method of FIG. 3, in accordance with embodiments of the present disclosure.

FIG. 7C depicts the example structure 700 following the formation of a portion of operation 312, in accordance with the third embodiment, wherein a sacrificial cap 760 is formed in direct contact with the uppermost surface 721 of the copper 720 and with inwardly facing surfaces 731 of the spacers 728 such that the sacrificial cap 760 is separated from the wetting layer 716 by the copper 720 and the spacers 728.

Figure 7D:
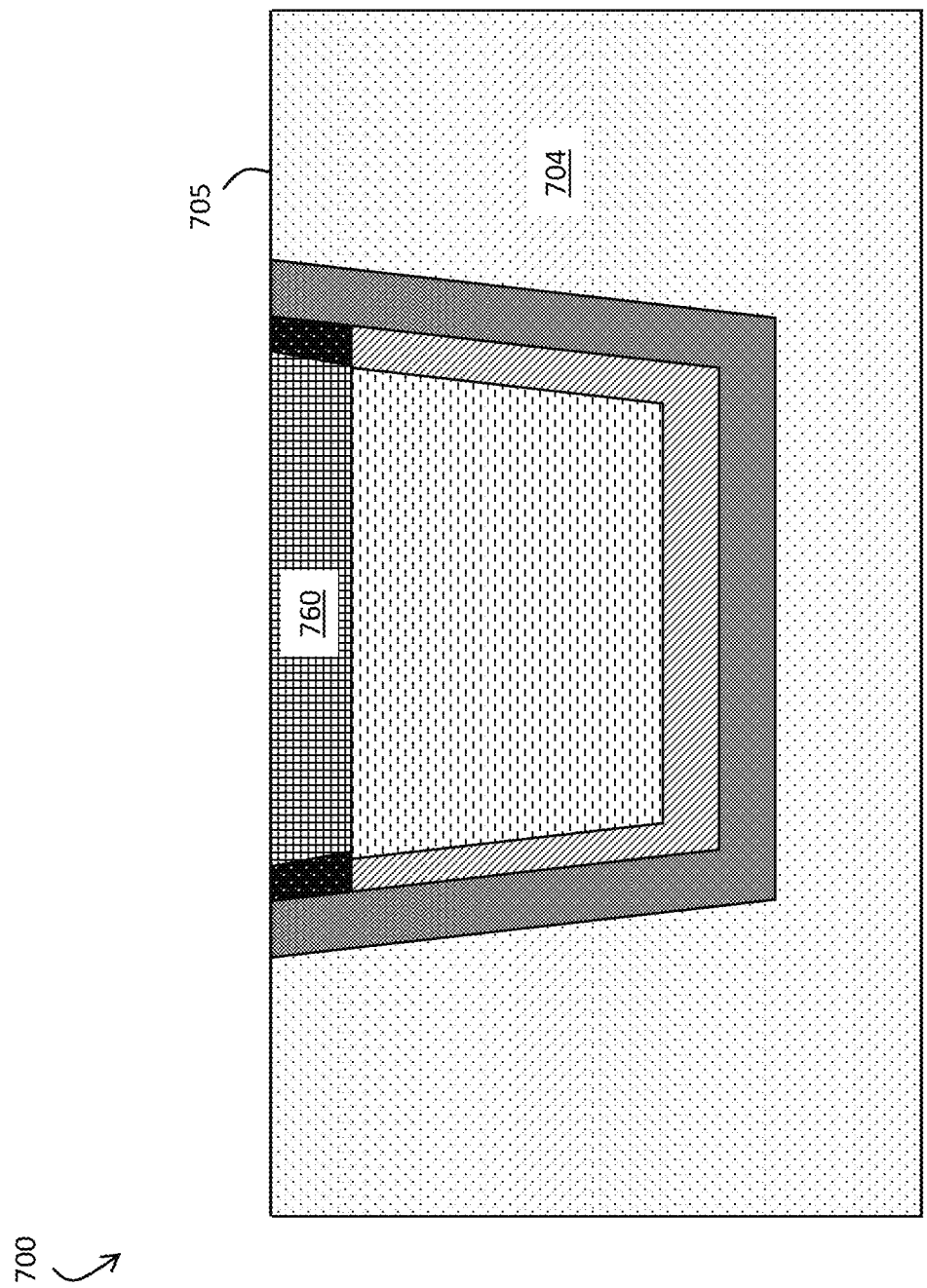
FIG. 7D illustrates an example of a component following the performance of a portion of the example method of FIG. 3, in accordance with embodiments of the present disclosure.

FIG. 7D depicts the example structure 700 following the removal of the sacrificial hard mask 750 (shown in FIG. 7B) and the portion of the sacrificial cap 760 which was arranged higher than the uppermost surface 705 of the dielectric layer 704.

Figure 7E:
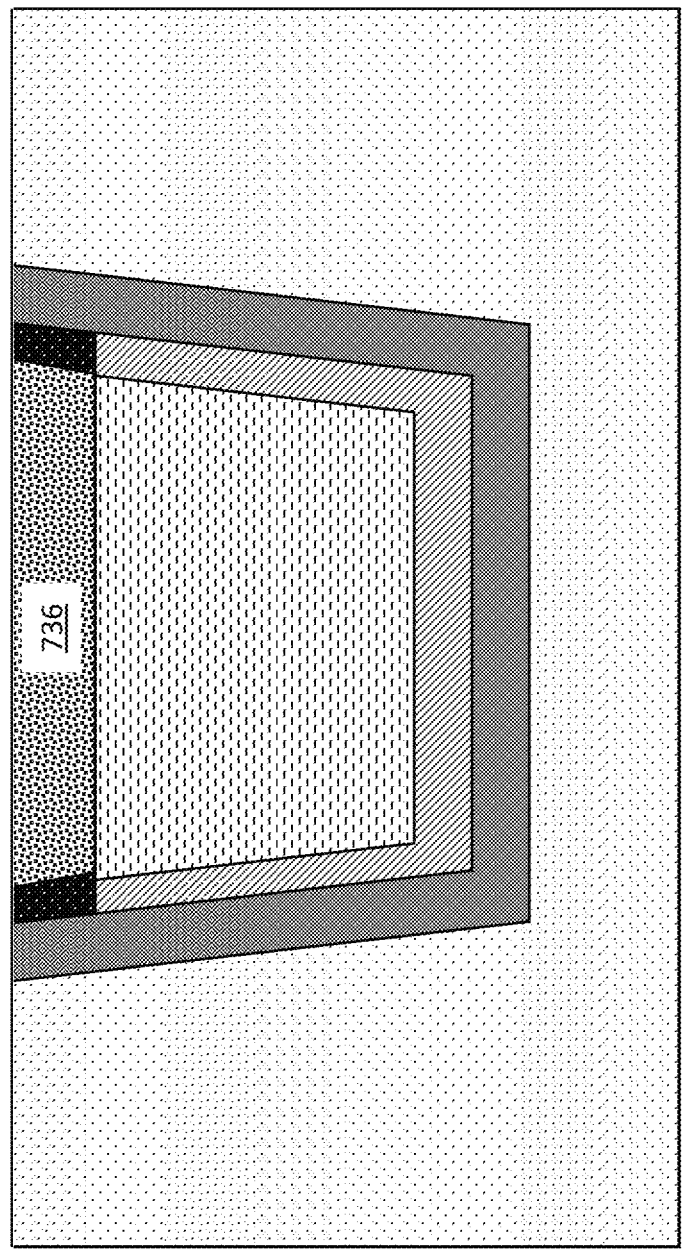
FIG. 7E illustrates an example of a component following the performance of a portion of the example method of FIG. 3, in accordance with embodiments of the present disclosure.

FIG. 7E depicts the example structure 700 following the replacement of the sacrificial cap 760 (shown in FIG. 7D) with the cap 736. Accordingly, the example structure 700 is substantially similar in structure and function to the example structure 400 shown in FIG. 5D following the performance of the method 300.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor component, comprising:
    a dielectric layer including an opening;
    a liner arranged in the opening in direct contact with the dielectric layer;
    a wetting layer arranged in the opening in direct contact with the liner;
    an interconnect structure arranged in the opening in direct contact with the wetting layer; and
    a cap arranged in the opening in direct contact with the interconnect structure and separated from the wetting layer by a spacer, wherein a lowermost surface of the spacer is in direct contact with an uppermost surface of the wetting layer.

2. The semiconductor component of claim 1, wherein an uppermost surface of the liner is substantially coplanar with an uppermost surface of the spacer.

3. The semiconductor component of claim 2, wherein the uppermost surface of the liner and the uppermost surface of the spacer are substantially coplanar with the uppermost surface of the wetting layer.

4. The semiconductor component of claim 2, wherein the uppermost surface of the liner and the uppermost surface of the spacer are arranged higher than the uppermost surface of the wetting layer.

5. The semiconductor component of claim 1, wherein an uppermost surface of the cap is substantially coplanar with an uppermost surface of the liner and an uppermost surface of the spacer.

6. The semiconductor component of claim 5, wherein the uppermost surface of the cap is substantially coplanar with the uppermost surface of the wetting layer.

7. The semiconductor component of claim 5, wherein the uppermost surface of the cap is arranged higher than the uppermost surface of the wetting layer.

8. The semiconductor component of claim 1, wherein:
the wetting layer is made of ruthenium; and
the cap is made of cobalt.

9. The semiconductor component of claim 1, wherein the spacer is made of a metal nitride.

10. The semiconductor component of claim 1, wherein the spacer is integrally formed with the liner.

11. The semiconductor component of claim 1, wherein the wetting layer is interposed between the liner and the spacer.

12. The semiconductor component of claim 1, wherein the cap is not in direct contact with the wetting layer.

13. The semiconductor component of claim 1, wherein:
a first side surface of the wetting layer is in direct contact with the liner; and
a second side surface of the wetting layer is opposite the first side surface of the wetting layer and is in direct contact with the spacer.

14. A method of making a semiconductor component, the method comprising:
forming a liner in an opening in a dielectric layer;
forming a wetting layer in the opening in direct contact with the liner;
forming an interconnect structure in the opening in direct contact with the wetting layer;
recessing the interconnect structure and the wetting layer relative to the dielectric layer;
forming a spacer on top of the wetting layer and in direct contact with the liner; and
forming a cap on top of the interconnect structure and in direct contact with the spacer such that the cap is not in direct contact with the wetting layer.

15. The method of claim 14, wherein forming the spacer includes:
depositing a layer of spacer material on top of the liner, the wetting layer, and the interconnect structure; and
selectively removing the layer of spacer material from on top of the liner and the interconnect structure.

16. The method of claim 14, wherein:
recessing the interconnect structure and the wetting layer includes recessing the liner relative to the dielectric layer; and
forming the spacer includes:
depositing a layer of spacer material on top of the liner, the wetting layer, and the interconnect structure; and
selectively removing the layer of spacer material from on top of the interconnect structure.

17. A method of making a semiconductor component, the method comprising:
forming a liner in an opening in a dielectric layer;
forming a wetting layer in the opening in direct contact with the liner;
forming an interconnect structure in the opening in direct contact with the wetting layer;
recessing the interconnect structure relative to the dielectric layer;
forming a spacer on top of the interconnect structure and in direct contact with the wetting layer, wherein a lowermost surface of the spacer is in direct contact with an uppermost surface of the wetting layer; and
forming a cap on top of the interconnect structure and in direct contact with the spacer such that the cap is not in direct contact with the wetting layer.

18. The method of claim 17, wherein forming the spacer includes:
depositing a layer of spacer material on top of the liner, the wetting layer, and the interconnect structure; and
selectively removing the layer of spacer material from on top of the liner, the wetting layer, and a portion of the interconnect structure.

19. The method of claim 18, wherein forming the cap includes depositing a layer of cap material on the portion of the interconnect structure from which the layer of spacer material was selectively removed.

\* \* \* \* \*